United States Patent
Huang et al.

(10) Patent No.: US 12,482,717 B2
(45) Date of Patent: Nov. 25, 2025

(54) TECHNIQUES FOR HEAT DISPERSION IN 3D INTEGRATED CIRCUIT

(71) Applicant: Taiwan Semiconductor Manufacturing Company, Ltd., Hsinchu (TW)

(72) Inventors: Chien Ta Huang, Taoyuan (TW); Chun-Yang Tsai, Hsinchu (TW); Yi Ching Ong, Hsinchu (TW); Kuo-Ching Huang, Hsinchu (TW); Harry-Hak-Lay Chuang, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 438 days.

(21) Appl. No.: 17/750,819

(22) Filed: May 23, 2022

(65) Prior Publication Data

US 2023/0378016 A1 Nov. 23, 2023

(51) Int. Cl.
*H01L 23/367* (2006.01)
*H01L 21/768* (2006.01)
(Continued)

(52) U.S. Cl.
CPC ...... *H01L 23/367* (2013.01); *H01L 21/76801* (2013.01); *H01L 23/3736* (2013.01); *H01L 23/528* (2013.01); *H01L 25/043* (2013.01); *H01L 25/117* (2013.01); *H01L 2224/24135* (2013.01); *H01L 2924/18161* (2013.01)

(58) Field of Classification Search
CPC . H01L 23/367; H01L 23/38; H01L 21/76801; H01L 23/3736; H01L 23/3732; H01L 23/528; H01L 23/043; H01L 25/117; H01L 23/481; H01L 23/3677; H01L 2224/24135; H01L 2924/18161; H01L 23/40; H01L 23/42; H01L 23/44;
(Continued)

(56) References Cited

U.S. PATENT DOCUMENTS

2013/0069225 A1* 3/2013 Lin .................. H01L 24/11
257/737
2014/0252624 A1* 9/2014 Huang .............. H01L 21/76835
438/643

(Continued)

OTHER PUBLICATIONS

Zhu et al Thermal conductivity of amorphous SiO2 thin film; Scientific Reports, 2018, pp. 1-9 (Year: 2018).*

(Continued)

*Primary Examiner* — Galina G Yushina
(74) *Attorney, Agent, or Firm* — Eschweiler & Potashnik, LLC

(57) ABSTRACT

Some embodiments relate to a method of forming a redistribution layer (RDL) stack of a 3D integrated circuit stack. The method comprises removing a substrate form the first side of a first die to expose a first dielectric layer. A spiral trench is formed in the first dielectric layer with one end of the spiral trench directly over a through silicon via (TSV) beneath the first dielectric layer. A first barrier layer is formed along sidewalls of the spiral trench, the first barrier layer being thermally coupled to the TSV. A first conductive wire is formed within the spiral trench, separated from the first dielectric layer by the barrier layer.

20 Claims, 20 Drawing Sheets

(51) Int. Cl.
   *H01L 23/373* (2006.01)
   *H01L 23/528* (2006.01)
   *H01L 25/04* (2023.01)
   *H01L 25/11* (2006.01)
(58) Field of Classification Search
   CPC . H01L 23/46; H01L 27/0207; H01L 23/3735; H01L 23/3737; H01L 23/3738
   See application file for complete search history.

(56) References Cited

U.S. PATENT DOCUMENTS

| | | | |
|---|---|---|---|
| 2017/0005069 A1* | 1/2017 | Chen | H01L 24/14 |
| 2017/0053902 A1 | 2/2017 | Yu et al. | |
| 2017/0133351 A1* | 5/2017 | Su | H01L 23/5389 |
| 2017/0154873 A1 | 6/2017 | Kim et al. | |
| 2020/0105635 A1* | 4/2020 | Yu | H01L 23/3677 |
| 2021/0057368 A1 | 2/2021 | Lin | |
| 2021/0066192 A1* | 3/2021 | Chen | H01L 23/5227 |
| 2021/0082784 A1 | 3/2021 | Cheng et al. | |
| 2021/0098423 A1* | 4/2021 | Chen | H01L 21/76877 |
| 2021/0280511 A1* | 9/2021 | Tai | H01L 24/09 |
| 2022/0020736 A1 | 1/2022 | Yip et al. | |
| 2022/0068883 A1 | 3/2022 | Xiao et al. | |
| 2022/0157689 A1* | 5/2022 | Chen | H01L 23/552 |

OTHER PUBLICATIONS

Zhou et al theoretical upper limits of the thermal conductivity of Si2Ni3, appl. Phys. Lett, 122 92023) (Year: 2023).*
Tong et al. Comprehensive first-principles analysis of phonon thermal conductivity and electronic-phonon coupling in different metals. Phys. Rev. B 100 (2019) (Year: 2019).*
Callister et al. "Materials Science and Engineering" 8th edition, chapter 19, ISBN 0470419970, published in 2009.
Li et al. "Reducing interfacial thermal resistance between metal and dielectric materials by a metal interlayer" J. Appl. Phys. 125, 045302 (2019); published on Jan. 25, 2019.
Ashby, Michael "Materials Selection in Mechanical Design (Fourth Edition), Chapter 4—Material Property Charts." Editor(s): Michael F. Ashby. Butterworth-Heinemann, 2011, ISBN 9781856176637, https://doi.org/10.1016/B978-1-85617-663-7.00004-7. Published on Jul. 27, 2012.

* cited by examiner

1900 ⇘

┌─────────────────────────────────────────────────────────────────┐
│ Remove a substrate from the first side of a first die to expose a first │ ─ 1902
│ dielectric layer │
└─────────────────────────────────────────────────────────────────┘
                                ↓
┌─────────────────────────────────────────────────────────────────┐
│ Form a spiral trench in the first dielectric layer with one end of the spiral │
│ trench directly over a through silicon via (TSV) beneath the first dielectric │ ─ 1904
│ layer │
└─────────────────────────────────────────────────────────────────┘
                                ↓
┌─────────────────────────────────────────────────────────────────┐
│ Form a first barrier layer along sidewalls of the spiral trench, the first │ ─ 1906
│ barrier layer being thermally coupled to the TSV │
└─────────────────────────────────────────────────────────────────┘
                                ↓
┌─────────────────────────────────────────────────────────────────┐
│ Form a first conductive wire within the spiral trench that is separated from │
│ the first dielectric layer by the first barrier layer and has a first phonon │
│ density of state (DOS) profile, wherein the first dielectric layer has a second │
│ phonon DOS profile, and wherein the first phonon DOS profile has a peak │ ─ 1908
│ outside the frequency range of the second phonon DOS profile, and wherein │
│ the first barrier layer has a third phonon DOS profile overlapping a peak of │
│ the first phonon DOS profile and overlapping a portion the second phonon │
│ DOS profile │
└─────────────────────────────────────────────────────────────────┘

Fig. 19

TECHNIQUES FOR HEAT DISPERSION IN 3D INTEGRATED CIRCUIT

BACKGROUND

The semiconductor industry continues to improve the integration density of various electronic components (e.g., transistors, diodes, resistors, capacitors, etc.) by, for example, reducing minimum feature sizes, which allows more components to be integrated into a given area. Smaller package structures, that utilize less area or smaller heights, are developed to package the semiconductor devices. For example, to further increase circuit density per area, three-dimensional (3D) integrated circuits (ICs) have been investigated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 illustrates a methodology of forming an RDL stack in accordance with some embodiments.

DETAILED DESCRIPTION

Figure 1:
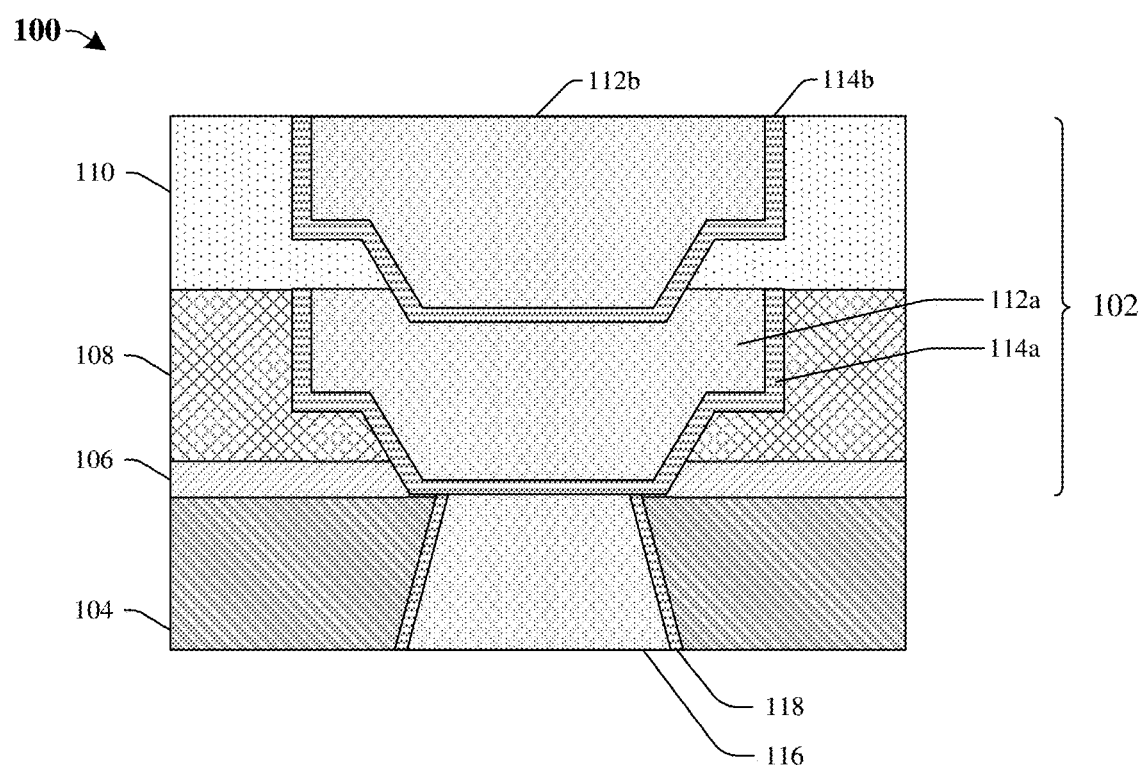
FIG. 1 illustrates a cross-sectional view of some embodiments of an integrated circuit including a redistribution layer (RDL) stack according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3D) integrated circuit (IC) includes two or more IC dies. These IC dies typically comprise a semiconductor substrate, a semiconductor device integrated on the semiconductor substrate, and an interconnect structure comprising alternating stacks of wiring layers and vias embedded in an interconnect dielectric layer. These IC dies also comprise a combination of bonding structures and through structure vias (TSVs) that electrically and thermally couple the IC dies. The bonding structures, TSVs, and interconnect structures are often surrounded by dielectric layers to electrically insulate the semiconductor devices from these connections. These dielectric layers conventionally comprise silicon oxide, silicon nitride, or glass.

Thus, the semiconductor devices in the IC dies are often surrounded by and in direct contact with dielectric materials that have inefficient heat dissipation. As some IC dies, such as a first die (e.g., a power management die), generate heat during their operation, first devices and second devices in an adjacent second die (e.g., a logic die) may get damaged by the buildup of heat that is unable to escape the device quickly.

Accordingly, various embodiments of the present disclosure present a 3D IC comprising a first die bonded to a second die. The first die includes a first substrate and a first interconnect structure, and includes first semiconductor devices with a higher thermal output during operation than second semiconductor devices in the second die. A redistribution layer (RDL) stack is disposed on an outer side of the first die opposite the second die. To enable efficient heat transfer from the 3D IC, a heat path including a through substrate via (TSV) extends from a conductive layer in the first interconnect structure, through the first substrate, and into the RDL stack. An RDL dielectric material included in the RDL stack separates the heat path from an ambient environment surrounding the 3D integrated circuit stack. The RDL dielectric material has an RDL thermal conductivity that is over twenty times an interconnect thermal conductivity of an interconnect dielectric material of the first interconnect structure. Thus, this arrangement enables efficient heat transfer from the 3D IC.

In other embodiments, a first conductive wire is thermally coupled to the first die and has a first phonon density of state (DOS) profile. A first dielectric layer surrounds the first conductive wire and has a second phonon DOS profile that is zero at a frequency of a peak of the first phonon DOS profile. A first barrier layer is between the first dielectric layer and the first conductive wire that has a third phonon DOS profile that is overlaps the peak of the first phonon DOS profile and a peak of the second phonon DOS profile. In some embodiments, the first phonon DOS profile and the third phonon DOS profile have peaks that do not overlap, and the first barrier layer is introduced to bridge the gap between the peak of the first phonon DOS profile and the peak of the second phonon DOS profile using the third phonon DOS profile, leading to a low interface thermal resistance, which reduces the amount of heat trapped in the 3D IC. In other embodiments, an additional barrier layer is introduced between the first conductive wire and the first dielectric layer to further increase the overlapping of the phonon DOS profiles of layers in contact.

FIG. 1 illustrates a cross-sectional view 100 of some embodiments of a redistribution layer (RDL) stack 102 according to the present disclosure. The RDL stack 102 is positioned above a semiconductor substrate 104 and in some embodiments comprises a composite dielectric 106, a first dielectric layer 108, and a second dielectric layer 110. In other embodiments, the composite dielectric 106 is not present, and the first dielectric layer 108 directly contacts the semiconductor substrate 104. In some embodiments, a first conductive wire 112a and a first barrier layer 114a are positioned within the first dielectric layer 108, and a second conductive wire 112b and a second barrier layer 114b are positioned within the second dielectric layer 110. In other embodiments, the first barrier layer 114a does not cover a top side of the first conductive wire 112a, and the first conductive wire 112a is in direct contact with the second dielectric layer 110. The first conductive wire 112a and the second conductive wire 112b are electrically and thermally coupled to a through silicon via (TSV) 116 through lower surfaces stacked directly above the TSV 116. The TSV 116 is positioned within the semiconductor substrate 104 and is surrounded by a via barrier layer 118. In some embodiments, a lowermost surface of the first barrier layer 114a is below a lowermost surface of the composite dielectric 106. In other embodiments, the lowermost surface of the first barrier layer 114a is above the lowermost surface of the composite dielectric 106.

The first conductive wire 112a comprises a material with a first phonon density of state (DOS) profile. The first dielectric layer 108 comprises a material with a second phonon DOS profile. In some embodiments, the second phonon DOS profile does not overlap (e.g., is zero at) a peak of the first phonon DOS profile. In some embodiments, the first barrier layer 114a is between the first dielectric layer 108 and the first conductive wire 112a, and has a third phonon DOS profile that overlaps the peak of the first phonon DOS profile and overlaps a portion the second phonon DOS profile. The overlapping phonon DOS profiles contribute to a lower thermal interface resistance, increasing the rate heat dissipates through the RDL stack 102.

In some embodiments, the first conductive wire 112a and the second conductive wire 112b respectively comprise a conductive metal with a first lattice constant and a first atomic mass, such as copper, gold, or some other conductive metal. In some embodiments, the second conductive wire 112b comprises the same material as the first conductive wire 112a. In some embodiments, the first barrier layer 114a and the second barrier layer 114b respectively comprise one of a group of materials with a second lattice constant and a second atomic mass, where the second lattice constant is less than the first lattice constant and the second atomic mass is less than the first atomic mass.

In some embodiments, the semiconductor substrate 104 and the first dielectric layer 108 are in direct contact, and the semiconductor substrate has a fourth phonon DOS profile that has a peak substantially aligned with (e.g., at a substantially equal frequency to) the peak of the second phonon DOS profile. The aligned peaks of the phonon DOS profiles cause a lower thermal interface resistance, which heat may dissipate through at a higher rate than in conventional RDL stacks.

In some embodiments, the first dielectric layer 108 comprises a material that is crystalline or polycrystalline with an average grain size greater than 2 nanometers. In further embodiments, the material of the first dielectric layer 108 has a thermal conductivity greater than 30 W/K*m and a dielectric constant between 4 and 10. In some embodiments, the second dielectric layer 110 comprises a material with a thermal conductivity less than the thermal conductivity of the material of the first dielectric layer 108, but greater than 20 W/K*m. In some embodiments, the second dielectric layer 110 and the first dielectric layer 108 respectively comprise one of carbon atoms arranged in a diamond cubic lattice, aluminum oxide, or some other material with a thermal conductivity greater than 20 W/K*m. In some embodiments, the second dielectric layer 110 and the first dielectric layer 108 comprise the same material.

Figure 2A:
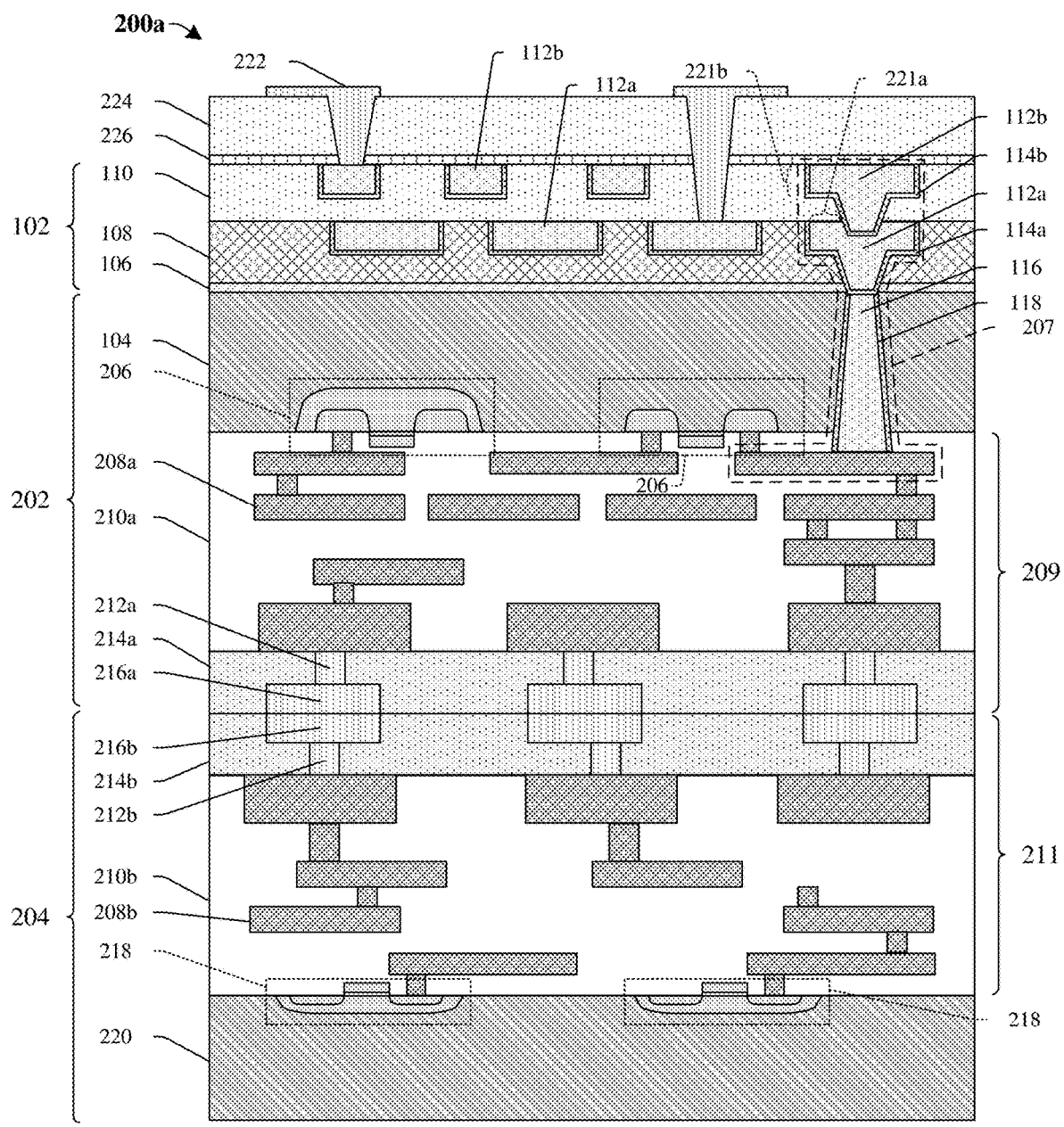
FIGS. 2A-2C illustrate multiple cross-sectional views of some additional embodiments of an integrated circuit including an RDL stack.
Figure 2B:
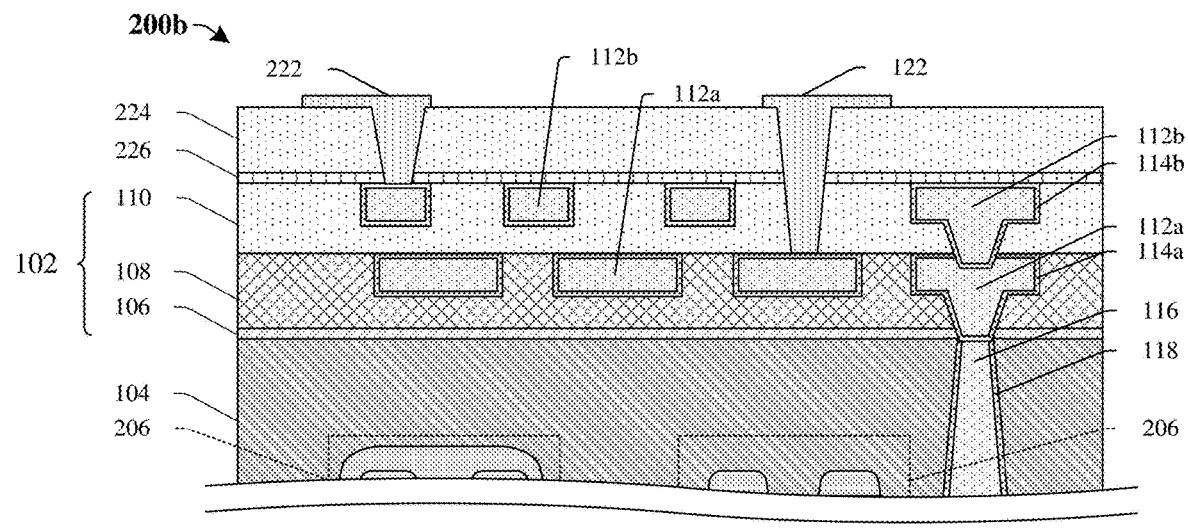
Figure 2C:
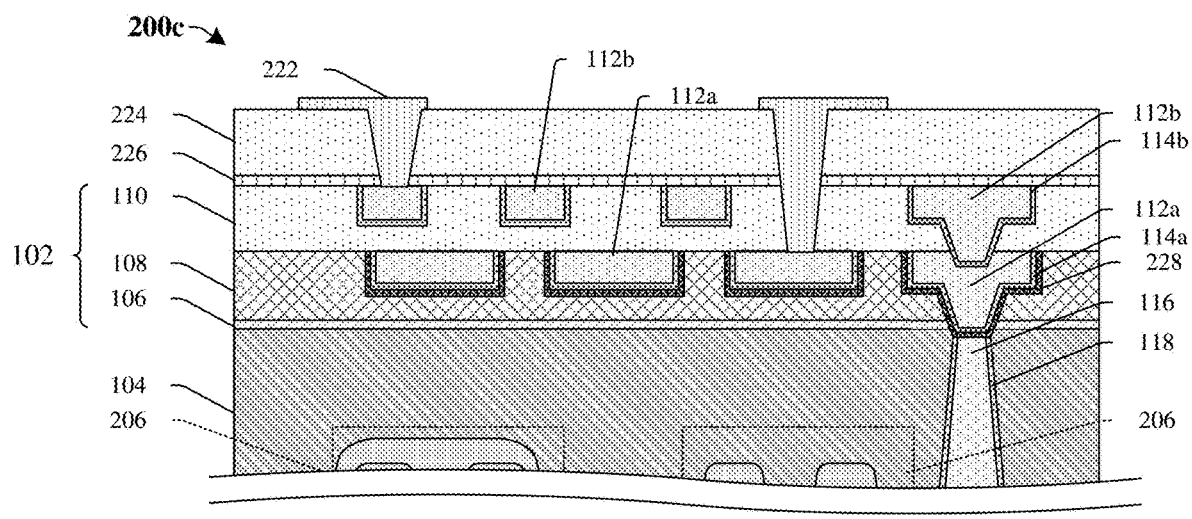

FIGS. 2A-2C illustrate multiple cross-sectional views 200a-200c of some additional embodiments of an integrated circuit including an RDL stack 102. In FIG. 2A, a first die 202 containing a first semiconductor substrate 104 is bonded to the RDL stack 102 on a first side. A second die 204 is bonded to the first die 202 on a second side opposite the first side. The first die 202 includes a first interconnect structure 209 on the first semiconductor substrate 104, and the second die 204 includes a second substrate 220 and a second interconnect structure 211 on the second substrate 220. In some embodiments, the first die 202 comprises a power management die and the second die 204 comprises a logic die.

To enable efficient heat transfer from within the 3D IC, a heat path 207 including TSV 116 extends from a conductive layer in the first interconnect structure 209, through the first semiconductor substrate 104, and into the RDL stack 102. An RDL dielectric material (e.g., 108, 110, 224, and/or 226) included in the RDL stack separates the heat path 207 from an ambient environment surrounding the 3D integrated circuit stack. The RDL dielectric material has an RDL thermal conductivity that is over twenty times an interconnect thermal conductivity of an interconnect dielectric material of the first interconnect structure 209, and/or that is over twenty times an interconnect thermal conductivity of an interconnect dielectric material of the second interconnect structure 211. Thus, because the RDL dielectric material has a higher conductivity and surrounds the heat path 207, the RDL dielectric material serves as an efficient way to relieve pent up heat from an interior region of the 3D IC.

A plurality of first semiconductor devices 206 are disposed on the semiconductor substrate 104. In some embodiments, one or more of the plurality of first semiconductor devices 206 are electrically and thermally coupled to the TSV 116 and the first conductive wire 112a. A first interconnect structure 208a arranged within a first interconnect dielectric layer 210a is connected to the first semiconductor devices 206. The first interconnect dielectric layer 210a is further electrically coupled to a first bonding via 212a. The first bonding via 212a is disposed within a first bonding dielectric structure 214a and is electrically coupled to a first bonding pad 216a.

The first bonding pad 216a of the first die is bonded to a second bonding pad 216b of the second die 204. The second bonding pad 216b is disposed within a second bonding dielectric structure 214b and is electrically coupled to a second interconnect structure 208b through a second bonding via 212b. The second interconnect structure 208b is disposed within a second interconnect dielectric layer 210b and is coupled to second semiconductor devices 218 disposed on a second substrate 220. In some embodiments, the second semiconductor devices 218 are rated to operate at a lower voltage than the first semiconductor devices 206. In some embodiments, the first semiconductor devices 206 have a higher thermal output during operation than the second semiconductor devices 218 during operation.

In some embodiments, the first interconnect dielectric layer 210a and the second interconnect dielectric layer 210b respectively comprise one of silicon oxide (e.g., $SiO_2$), glass, or some other insulative material. In some embodiments, the first interconnect dielectric layer 210a has a first thermal conductivity. In some embodiments, the first dielectric layer 108 and/or second dielectric layer 110 has a thermal conductivity that is greater than the thermal conductivity of the first interconnect dielectric layer 210a. For example, the thermal conductivity of the first dielectric layer 108 and/or second dielectric layer 110 can be greater than the thermal conductivity of the first interconnect dielectric layer 210a by a factor of 20 or more, 40 or more, 50 or more, 100 or more, or other amounts.

In some embodiments, the RDL stack 102 comprises a first interface 221a between the first conductive wire 112a and a second dielectric layer 110, wherein a first interfacial thermal resistivity of the first interface 221a is greater than a second interfacial thermal resistivity of a second interface 221b between the second barrier layer 114b and the second dielectric layer 110. In some embodiments, the RDL stack 102 is thermally coupled to the first die 202 both through the TSV 116 and through the composite dielectric 106 between the semiconductor substrate 104 of the first die 202 and the first dielectric layer 108, while the semiconductor substrate 104 and the first dielectric layer 108 are electrically isolated from one another by the composite dielectric 106.

Bonding pads 222 are electrically coupled to the first conductive wire 112a and the second conductive wire 112b on a side of the RDL stack 102 opposite of the first die 202. The bonding pads 222 are disposed within a third dielectric layer 224 and extend through an etch stop layer 226 that is between the second dielectric layer 110 and the third dielectric layer 224. In some embodiments, the third dielectric layer 224 comprises a same material as the second dielectric layer 110. In some embodiments, the etch stop layer 226 electrically isolates the third dielectric layer 224 from the second dielectric layer 110. In some embodiments, the etch stop layer 226 comprises one of silicon oxide (e.g., silicon dioxide ($SiO_2$)), silicon nitride (e.g., $Si_3O_4$), or another suitable material.

In FIG. 2B, an alternative embodiment of the RDL stack 102 is shown. In this embodiment, the first barrier layer 114a extends over the first conductive wire 112a and the second barrier layer 114b surrounds all sides of the second conductive wire 112b. In some embodiments, the third phonon DOS profile of the first barrier layer 114a overlaps a peak of the second phonon DOS profile of the first dielectric layer 108, lowering the thermal interface resistance between the first barrier layer 114a and the first dielectric layer 108. Thus, this embodiment increases the amount of surface area of the first and second conductive wires 112a-112b with a reduced thermal interface resistance.

In FIG. 2C, an alternative embodiment of the RDL stack 102 is shown. In this embodiment, an additional barrier layer 228 surrounds the first conductive wire 112a. In some embodiments, the third phonon DOS profile of the first barrier layer 114a does not overlap a peak of the second phonon DOS profile of the first dielectric layer 108, such that the first barrier layer 114a and the first dielectric layer 108 would have an increased thermal interface resistance if they were directly contacting. The additional barrier layer 228 has an additional phonon DOS profile that overlaps a peak of the second phonon DOS profile and a peak of the third phonon DOS profile. This additional barrier layer 228 lowers the thermal interface resistance between the first barrier layer 114a and the first dielectric layer 108 by bridging the gap between the peaks of their phonon DOS profiles. In some embodiments, the additional barrier layer 228 is aluminum oxide and the first dielectric layer 108 includes carbon atoms arranged in a diamond cubic lattice (e.g., one or more diamond crystals).

Figure 3A:
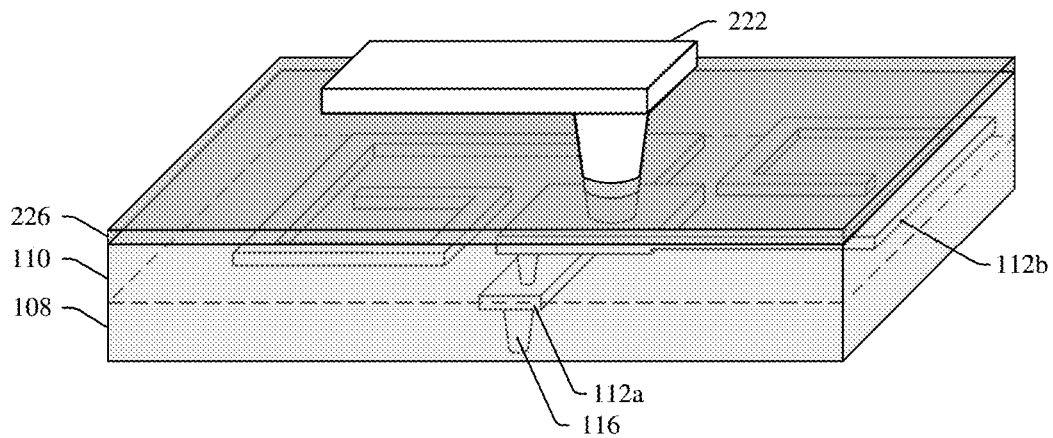
FIGS. 3A-3B illustrates a 3-dimensional view of some additional embodiments of an integrated circuit including an RDL stack.
Figure 3B:
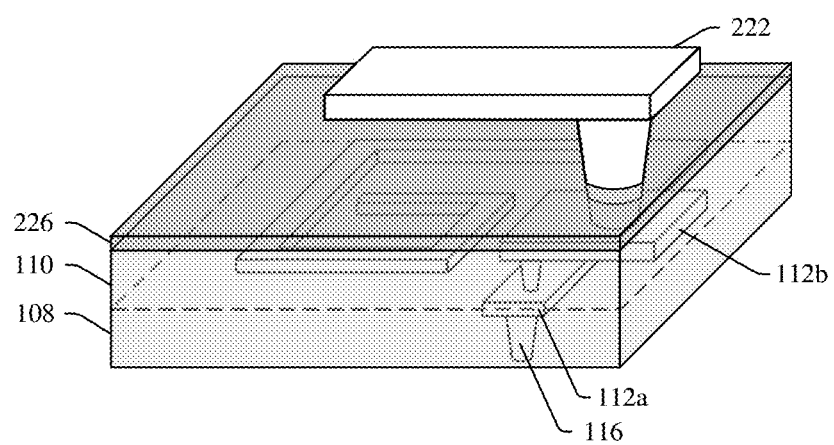

FIGS. 3A-3B illustrate 3-dimensional views 300a, 300b of some additional embodiments of an integrated circuit including an RDL stack. In some embodiments, the first conductive wire 112a extends from the TSV 116 coupled to the first die (not shown) in a spiral pattern. In further embodiments, the second conductive wire 112b is thermally coupled to the first conductive wire 112a and is in a second spiral pattern different from the first spiral pattern. In FIG. 3A, the spiral pattern of the second conductive wire 112b is displaced from the spiral pattern of the first conductive wire 112a such that the second conductive wire 112b directly overlies one segment of the first conductive wire 112a. FIG. 3B shows another embodiment where the second conductive wire 112b has a rectangular shape as viewed from above.

Figure 4A:
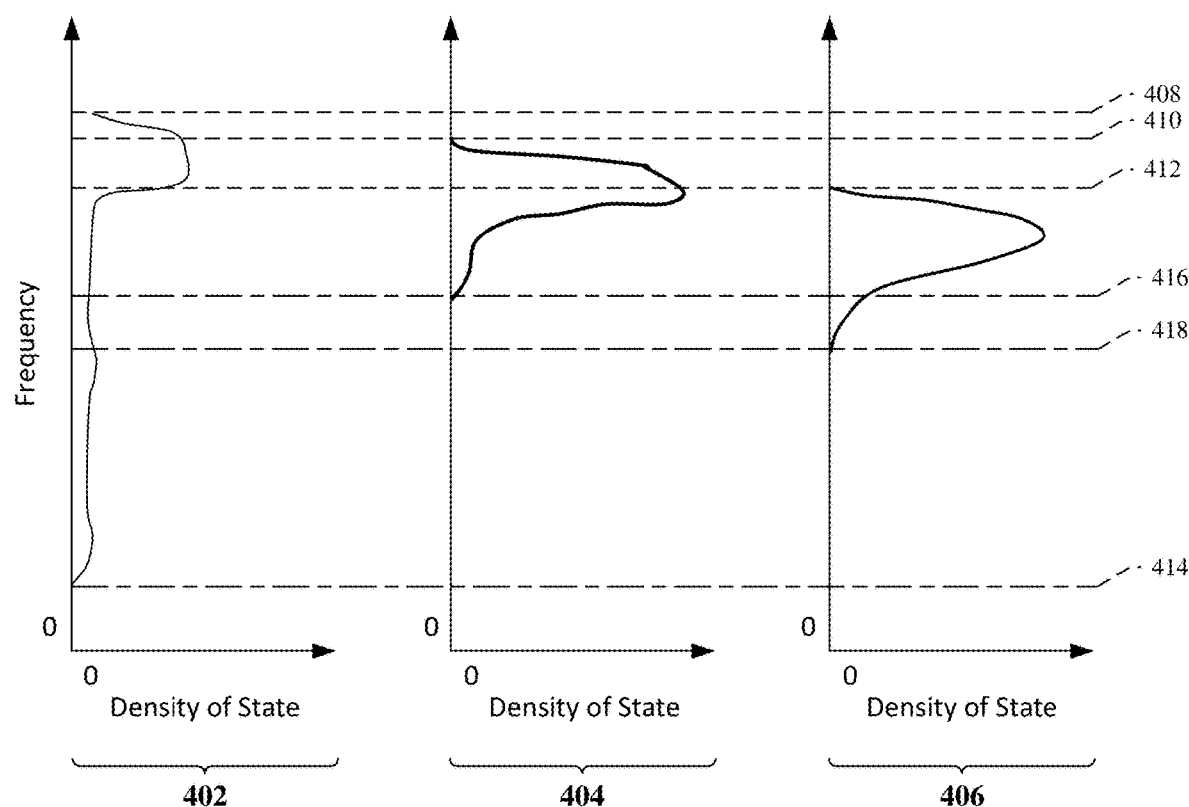
FIGS. 4A-4B illustrate density of state profiles for some embodiments of an integrated circuit including an RDL stack.
Figure 4B:
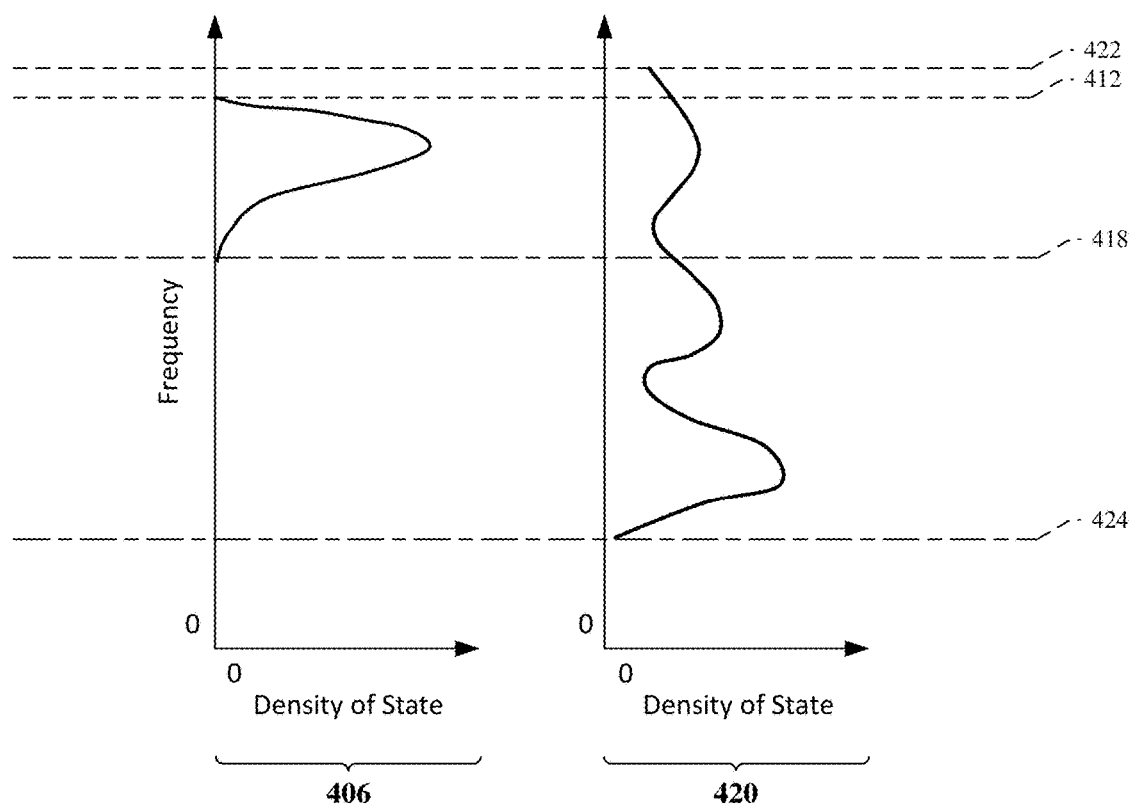

FIGS. 4A-4B illustrate phonon density of state profiles 400a, 400b for some embodiments of an integrated circuit including an RDL stack.

FIG. 4A shows a graph of the first phonon DOS profile 402 of the first conductive wire (e.g., 112a of FIG. 1) on the left. A graph of the second phonon DOS profile 406 of the first dielectric layer (e.g., 108 of FIG. 1) is shown on the right. A graph of the third phonon DOS profile 404 of the first barrier layer (e.g., 114a of FIG. 1) is shown in between the first phonon DOS profile 402 and the second phonon DOS profile 406. With regard to the embodiments of FIG. 2A, the first phonon DOS profile can correspond to the first conductive wire 112a, the second phonon DOS profile can correspond to the first dielectric layer 108, and the third phonon DOS profile can correspond to the first barrier layer 114a. The maximum frequencies 408, 410, 412 of the first, third and second phonon DOS profiles 402, 404, 406 respectively are depicted as well as the respective minimum frequencies 414, 416, 418. In some embodiments, the maximum frequency 412 of the second phonon DOS profile 406 is less than the frequency of the peak of the first phonon DOS profile 402. In some embodiments, the third phonon DOS profile 404 overlaps a peak of the first phonon DOS profile 402 and a peak of the second phonon DOS profile 406. In this way, phonons with frequencies between the maximum frequency 410 and minimum frequency 416 of the third phonon DOS profile 404 are able to propagate through the interfaces between the first barrier layer 114a and both the first dielectric layer 108 and the first conductive wire 112a. The peaks of the first and second phonon DOS profiles 402, 406 being between the maximum frequency 410 and minimum frequency 416 of the third phonon DOS profile 404 increases the number of phonons that fall within the range of the third phonon DOS profile 404, which leads to a drop in interface thermal resistance.

FIG. 4B shows the graph of the second phonon DOS profile 406 on the left. The fourth phonon DOS profile 420 in some embodiments is shown on the right. In some embodiments, the fourth phonon DOS profile 420 has a maximum frequency 422 and a minimum frequency 424 surrounding the peak of the second phonon DOS profile 406. In some embodiments, a peak of the fourth phonon DOS profile 420 is substantially aligned with a second peak of the second phonon DOS profile 406. In this way, thermal transfer between the semiconductor substrate 104 and the first dielectric layer 108 with a low thermal interface resistance is possible without a composite dielectric 106. In some embodiments, the peak of the fourth phonon DOS profile is substantially unaligned with the peak of the second phonon DOS profile, such that a composite dielectric 106 is introduced to provide a phonon DOS profile that bridges the gap between the peaks of the fourth phonon DOS profile and the second phonon DOS profile.

With reference to FIGS. 5 through 18, a series of incremental manufacturing steps of some embodiments of a method for forming an RDL stack on a 3D IC with decreased thermal interface resistance are provided. Although FIGS. 5 through 18 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
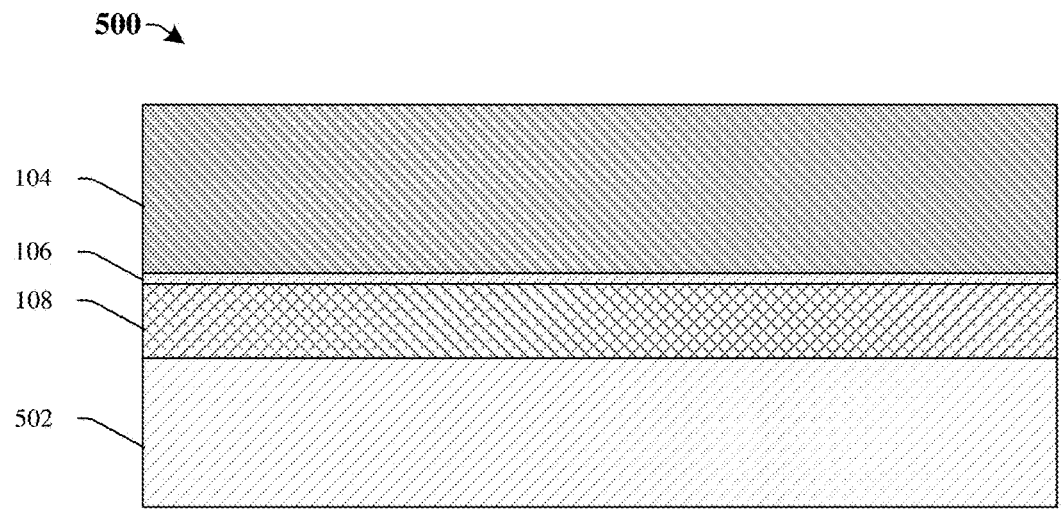
FIGS. 5 through 18 illustrate a series of incremental manufacturing steps of some embodiments of a method for forming an RDL stack with decreased thermal interface resistance.

As shown in cross-sectional view 500 of FIG. 5, the semiconductor substrate 104, the composite dielectric 106, and the first dielectric layer 108 are provided on a carrier substrate 502. The semiconductor substrate 104 can be epitaxially grown silicon, bulk silicon, or another suitable material and has a thickness between approximately 2 micrometers and approximately 4 micrometers. In some embodiments, the composite dielectric 106 is contacting a lower surface of the semiconductor substrate 104 and may comprise one of aluminum oxide ($Al_2O_3$), titanium oxide ($TiO_2$), another electrically insulative oxide layer, or a combination of one or more of the foregoing. The composite dielectric 106 has a thickness equal to or less than approximately 1 micrometer. In some embodiments, the first dielectric layer 108 is between the composite dielectric 106 and the carrier substrate 502. The first dielectric layer 108 has a thickness between approximately 2 micrometers and approximately 4 micrometers. Other suitable thicknesses are within the contemplated scope of the disclosure. In some embodiments, the carrier substrate 502 can be a bulk silicon substrate or a semiconductor-on-insulator (SOI) substrate (e.g., silicon on insulator substrate). The carrier substrate 502 can also be a binary semiconductor substrate (e.g., GaAs), a tertiary semiconductor substrate (e.g., AlGaAs), or a higher order semiconductor substrate, for example. In many instances, the carrier substrate 502 manifests as a semiconductor wafer.

Figure 6:
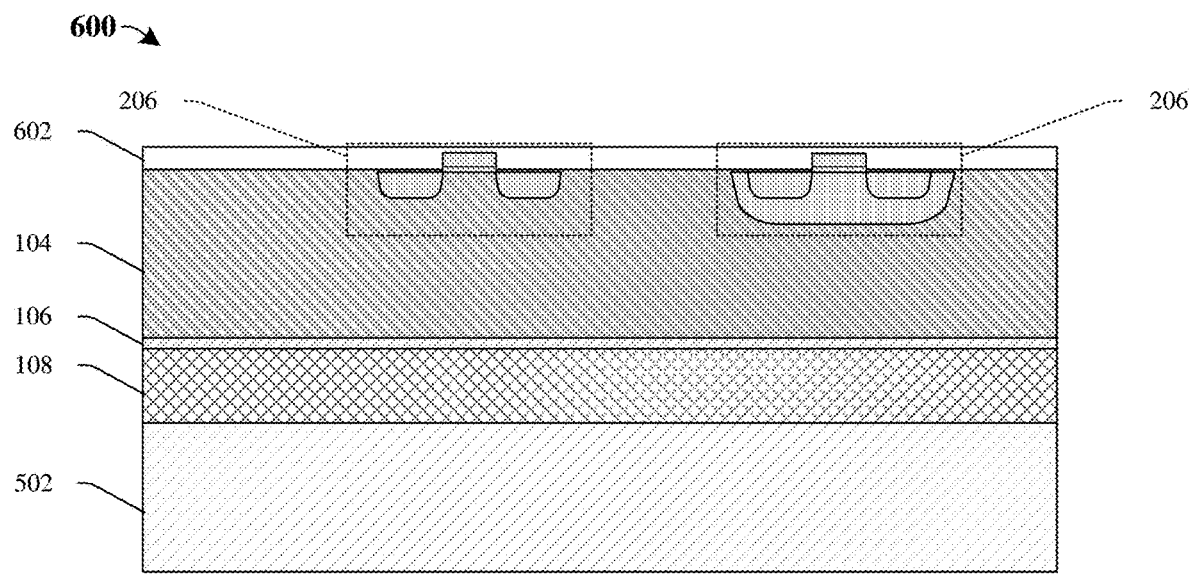

As shown in cross-sectional view 600 of FIG. 6, first semiconductor devices 206 are formed on the semiconductor substrate 104 and covered in an intermediate dielectric layer 602. It will be appreciated that the first semiconductor devices 206 are formed on the semiconductor substrate 104 by processes to form complementary metal-oxide-semiconductors (CMOS) or other processes. The intermediate dielectric layer 602 is made of a dielectric material, such as an oxide, a nitride, an ELK dielectric, or another suitable material. In some embodiments, the intermediate dielectric layer 602 comprises $SiO_2$.

Figure 7:
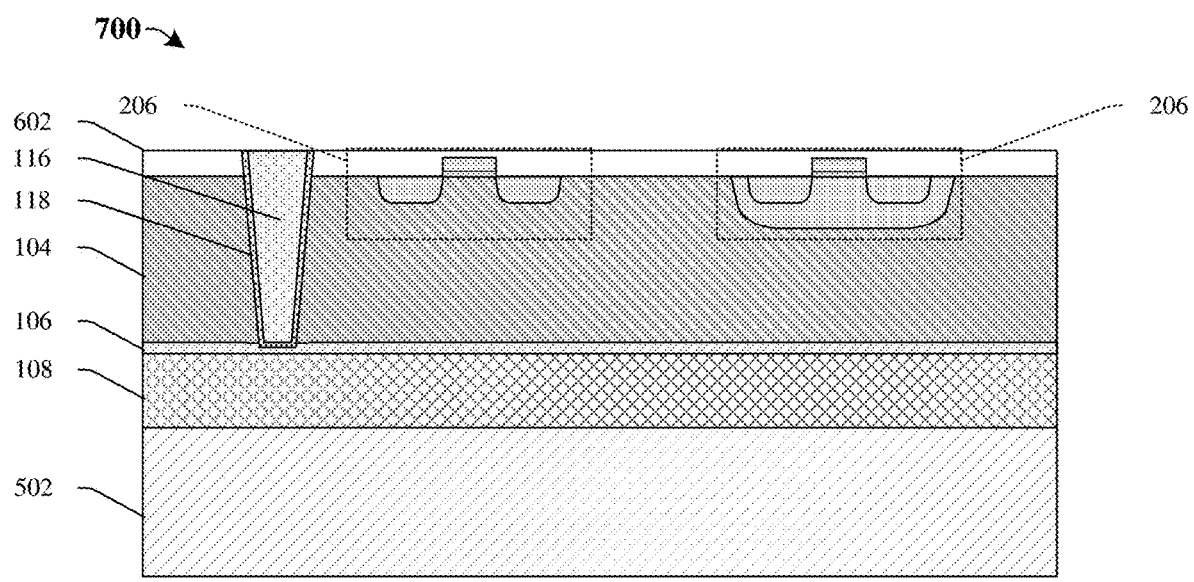

As shown in cross-sectional view 700 of FIG. 7, the through silicon via (TSV) 116 is formed in the semiconductor substrate 104, and extends from the top of the intermediate dielectric layer 602 into the composite dielectric 106. The TSV is formed by etching a via hole (not shown) into the semiconductor substrate 104, then forming a conformal via barrier layer 118 in the via hole. The via hole is then filled with conductive material to form the TSV 116. The TSV 116 may be a conductive metal such as copper (Cu), gold (Au), or other conductive metals. The via barrier layer 118 may be a conductive material with a lattice constant and atomic mass less than that of the conductive metal of the TSV 116. In some embodiments, the conductive material of the via barrier layer is nickel. In some embodiments, the conductive material of the via barrier layer can be one of nickel, titanium nitride, tantalum nitride, titanium, tantalum, or a combination of one or more of the foregoing. In some embodiments, the first conformal conductive layer 1502 is formed using a deposition process (e.g., and atomic layer deposition (ALD) process).

Figure 8:
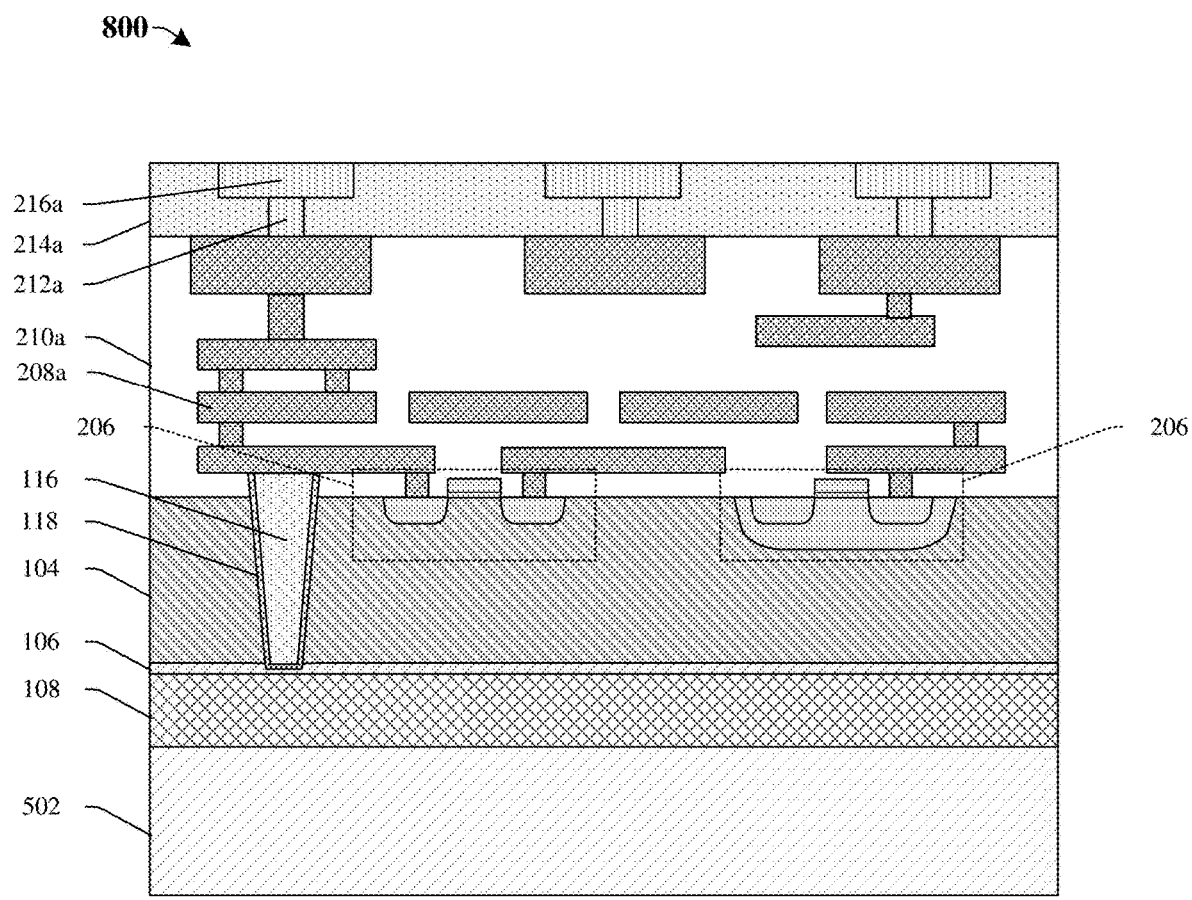

As shown in cross-sectional view 800 of FIG. 8, a first interconnect structure 208a is formed electrically coupling at least one high voltage device of the first semiconductor devices 206 to the TSV 116. The first interconnect structure 208a also is electrically coupled to the first bonding pads 216a through the first bonding vias 212a within the first bonding dielectric structure 214a. The first interconnect structure 208a, the first bonding vias 212a, and the first bonding pads 216a may respectively comprise a metal, such as copper or aluminum. The first interconnect structure 208a is surrounded by a first interconnect dielectric layer 210a. In some embodiments, the first interconnect dielectric layer 210a and the first bonding dielectric structure 214a may respectively comprise one of silicon oxide (e.g., $SiO_2$), silicon nitride, silicon carbide, $Si_3N_4$, SiON, borosilicate glass (BSG), borophosphosilicate glass (BPSG), or a combination of one or more of the foregoing.

Figure 9:
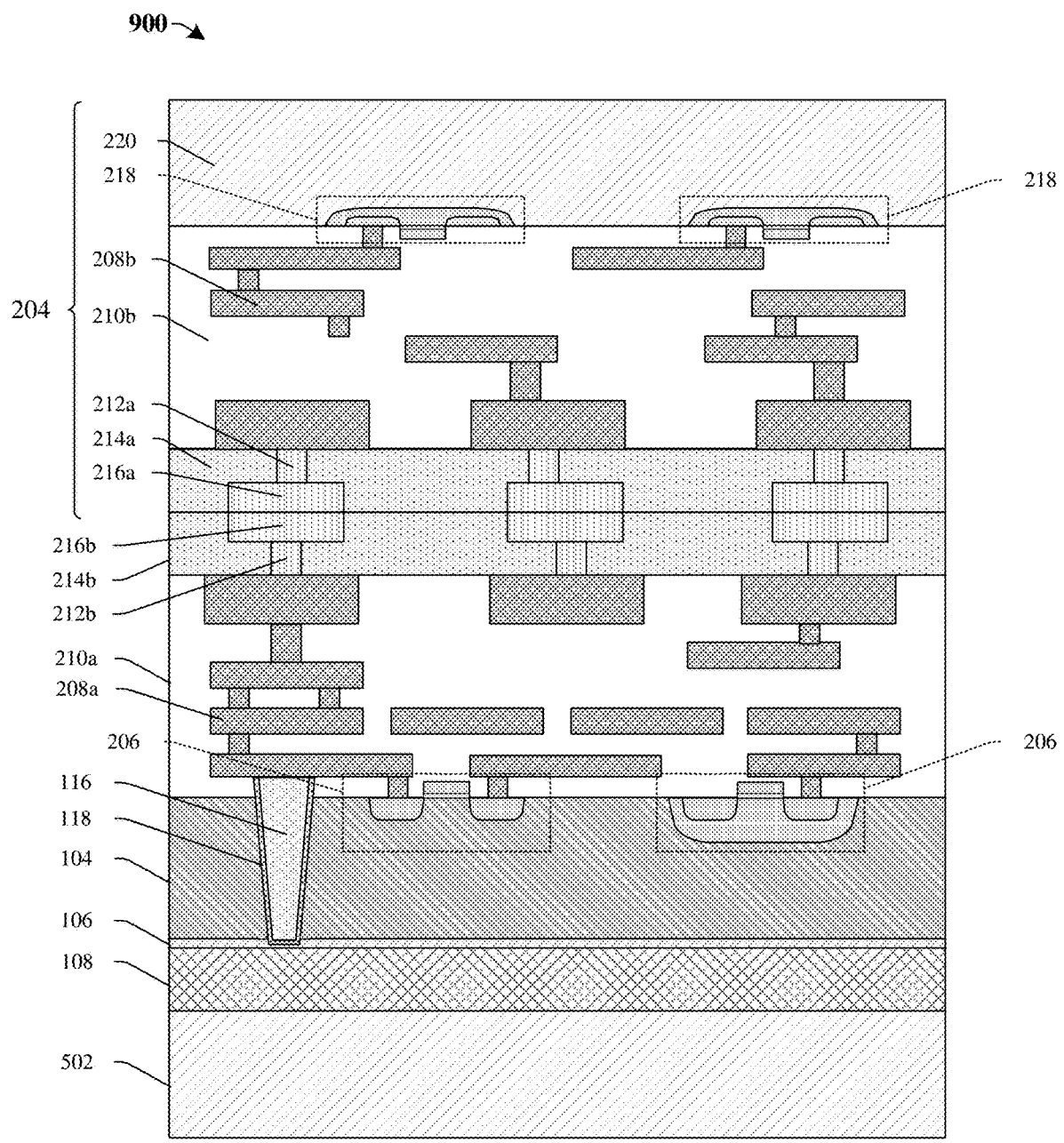

As shown in cross-sectional view 900 of FIG. 9, the second die 204 is bonded to the first bonding pads 216a. The second die 204 is bonded to the first bonding pads 216a through second bonding pads 216b, which are electrically coupled to the second interconnect structure 208b and the second semiconductor devices 218.

Figure 10:
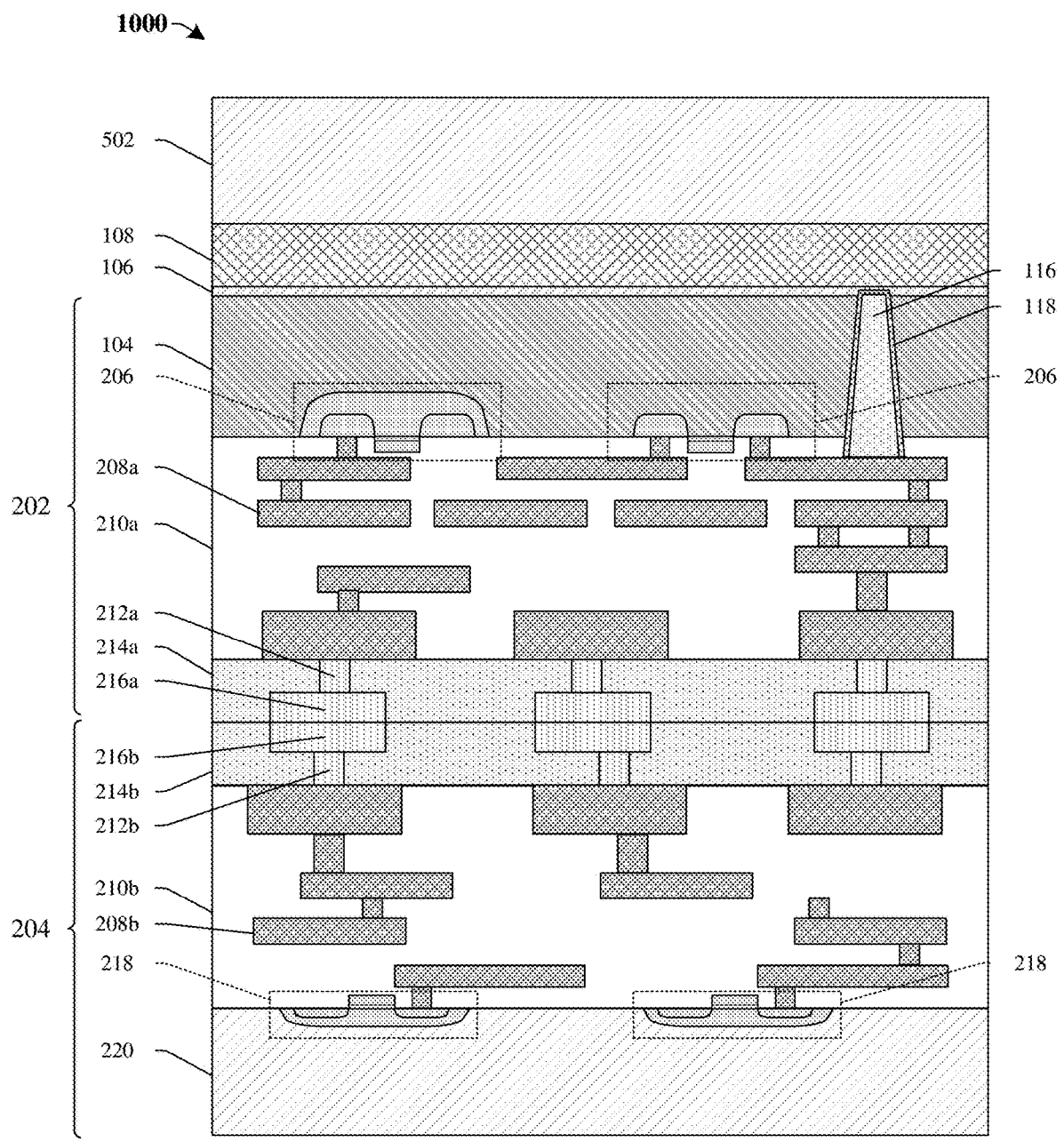

As shown in the cross-sectional view 1000 of FIG. 10, the stack of dies formed in previous steps is flipped over, such that the second die 204 is beneath the first die 202, and the process flow is continued on the other side of the 3D IC.

Figure 11:
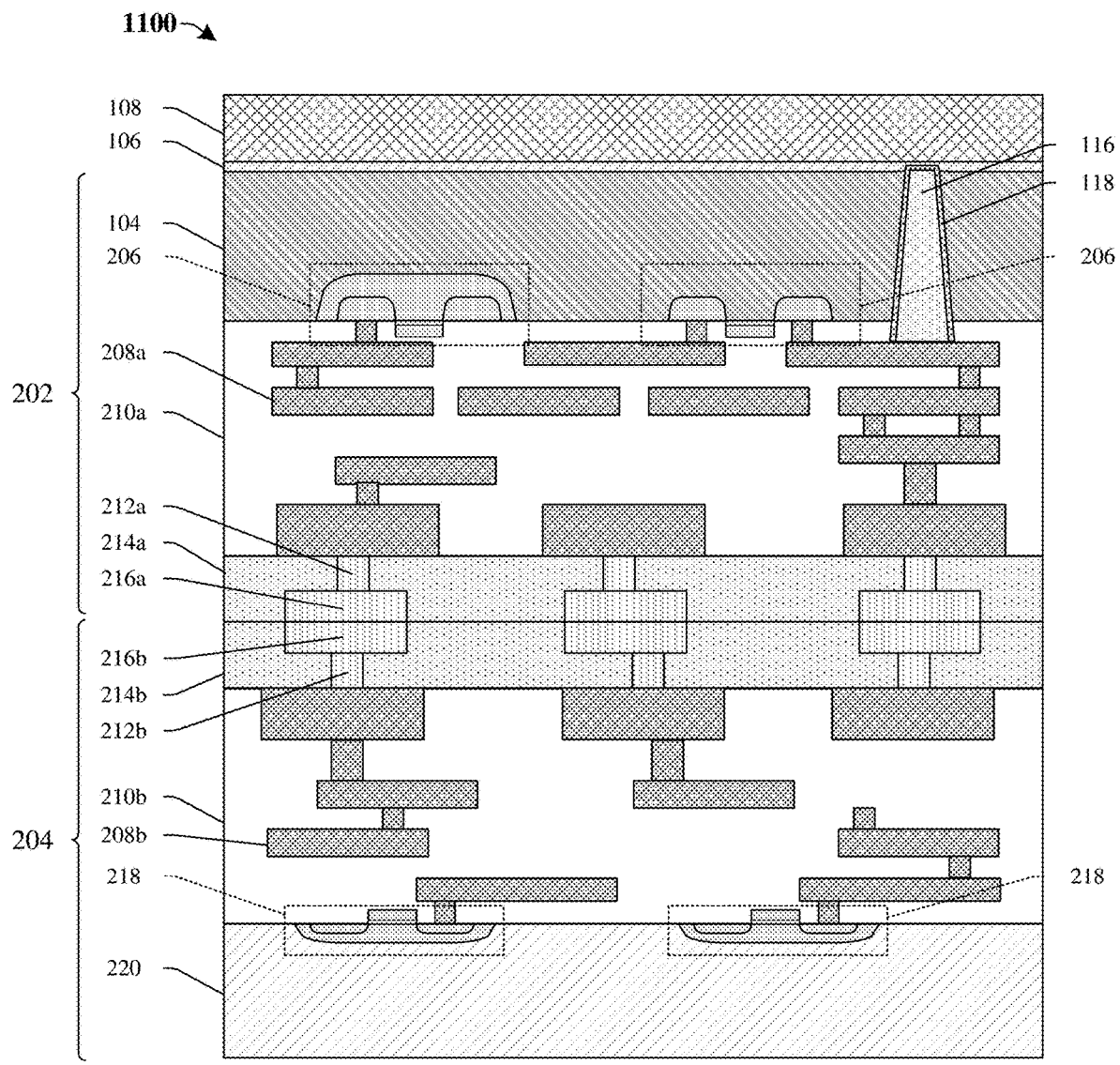

As shown in the cross-sectional view 1100 of FIG. 11, the carrier substrate 502 is removed from the first die 202, exposing the first dielectric layer 108. In some embodiments, the carrier substrate 502 is removed using a planarization (e.g., a chemical mechanical polishing or chemical mechanical planarization (CMP)) process. Other suitable processes are within the contemplated scope of the disclosure.

Figure 12:
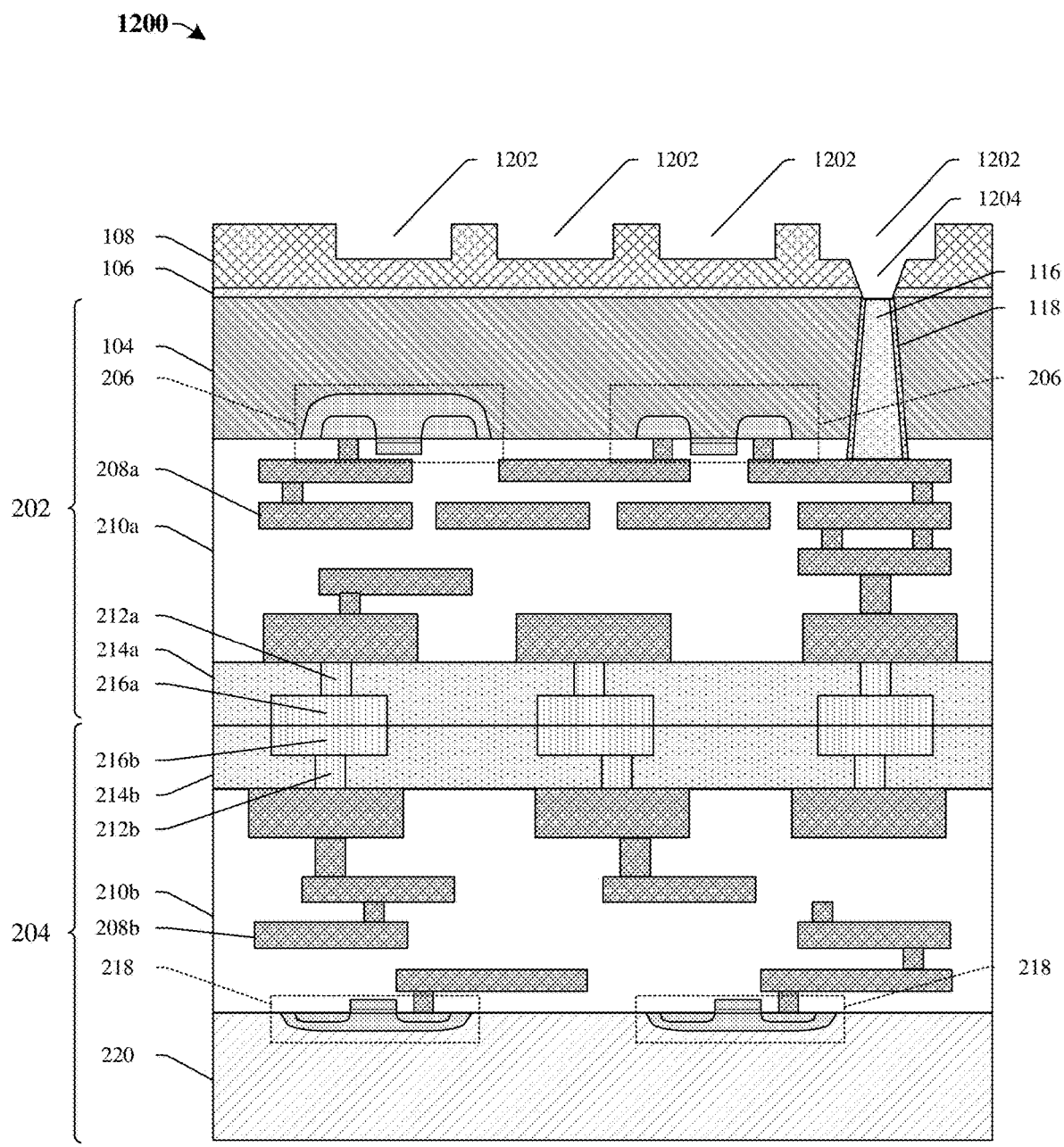

As shown in the cross-sectional view 1200 of FIG. 12, a first spiral trench 1202 and a first via hole 1204 are formed in the first dielectric layer 108. The first spiral trench 1202 is inset into a top surface of the first dielectric layer 108, and the first via hole 1204 extends through the composite dielectric 106 to the TSV 116. In some embodiments, the first spiral trench 1202 and the first via hole 1204 are formed using a plasma dry etching process. Other suitable processes are within the contemplated scope of the disclosure.

Figure 13:
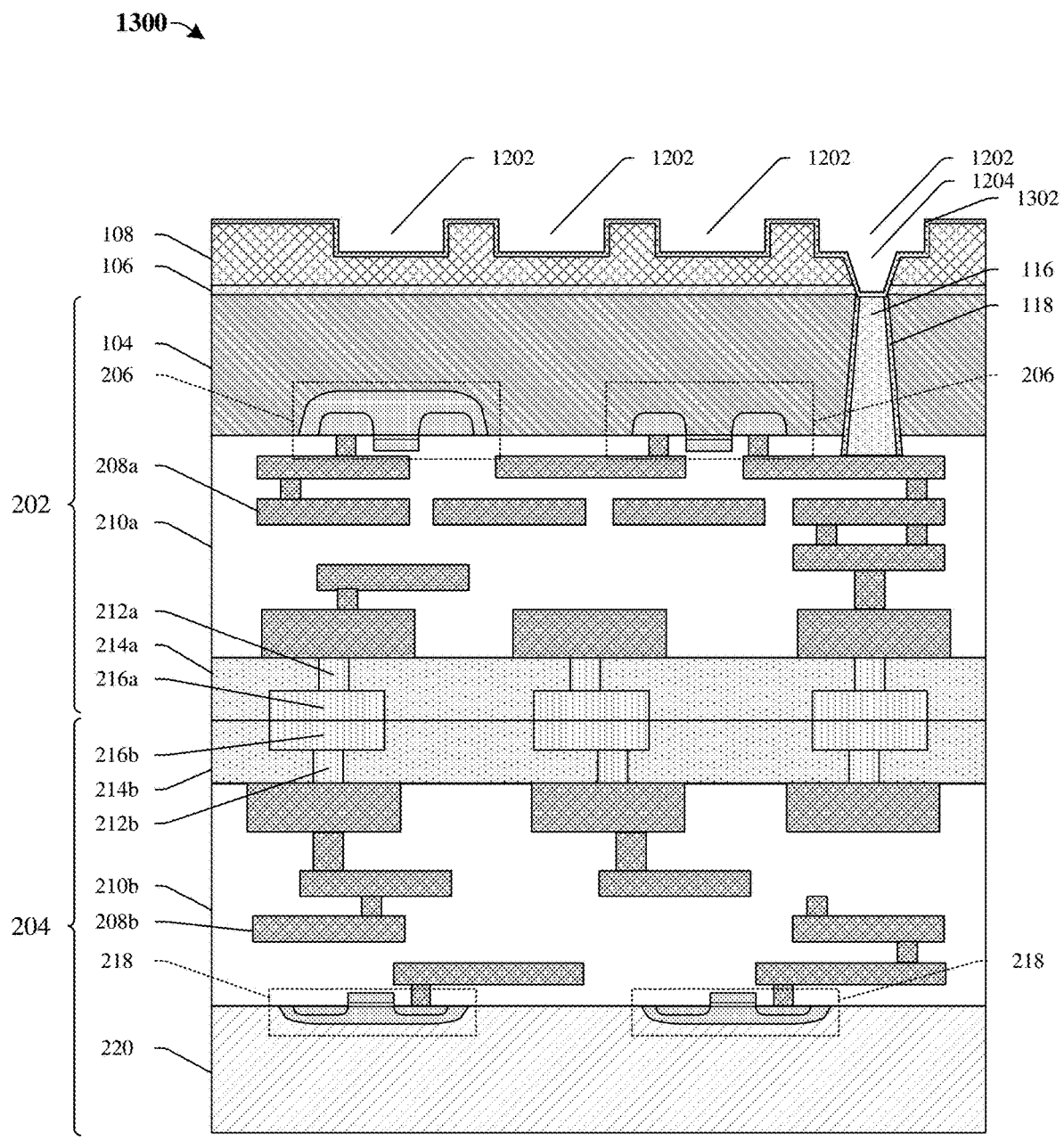

As shown in the cross-sectional view 1300 of FIG. 13, a first conformal barrier layer 1302 is formed over the surface of the first dielectric layer 108 and within the first spiral trench 1202 and the first via hole 1204. In some embodiments, the first conformal barrier layer comprises the same material as the via barrier layer 118. The first conformal barrier layer 1302 extends from a topmost surface of the first dielectric layer to the TSV 116. In some embodiments, the first conformal barrier layer 1302 has a bottommost surface that extends below the bottommost surface of the composite dielectric 106. In other embodiments, the first conformal barrier layer 1302 has a bottommost surface above the bottommost surface of the composite dielectric 106.

Figure 14:
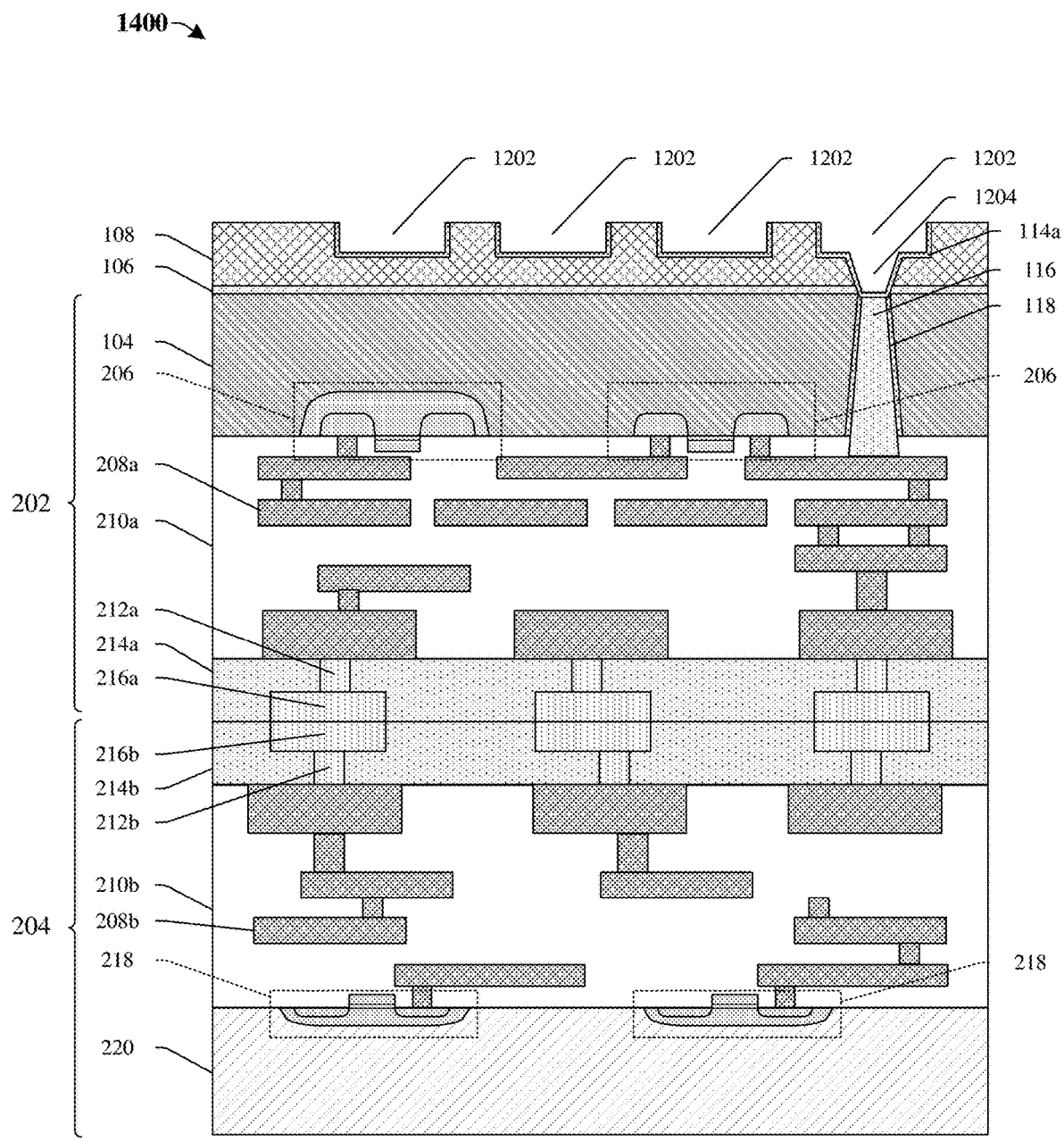

As shown in the cross-sectional view 1400 of FIG. 14, portions of the first conformal barrier layer 1302 above the first dielectric layer 108 are removed, leaving the first barrier layer 114a within the first spiral trench 1202 and the first via hole 1204. In some embodiments, the portions of the first conformal barrier layer 1302 are removed using a chemical mechanical polishing or chemical mechanical planarization (CMP) process. Other suitable processes are within the contemplated scope of the disclosure.

Figure 15:
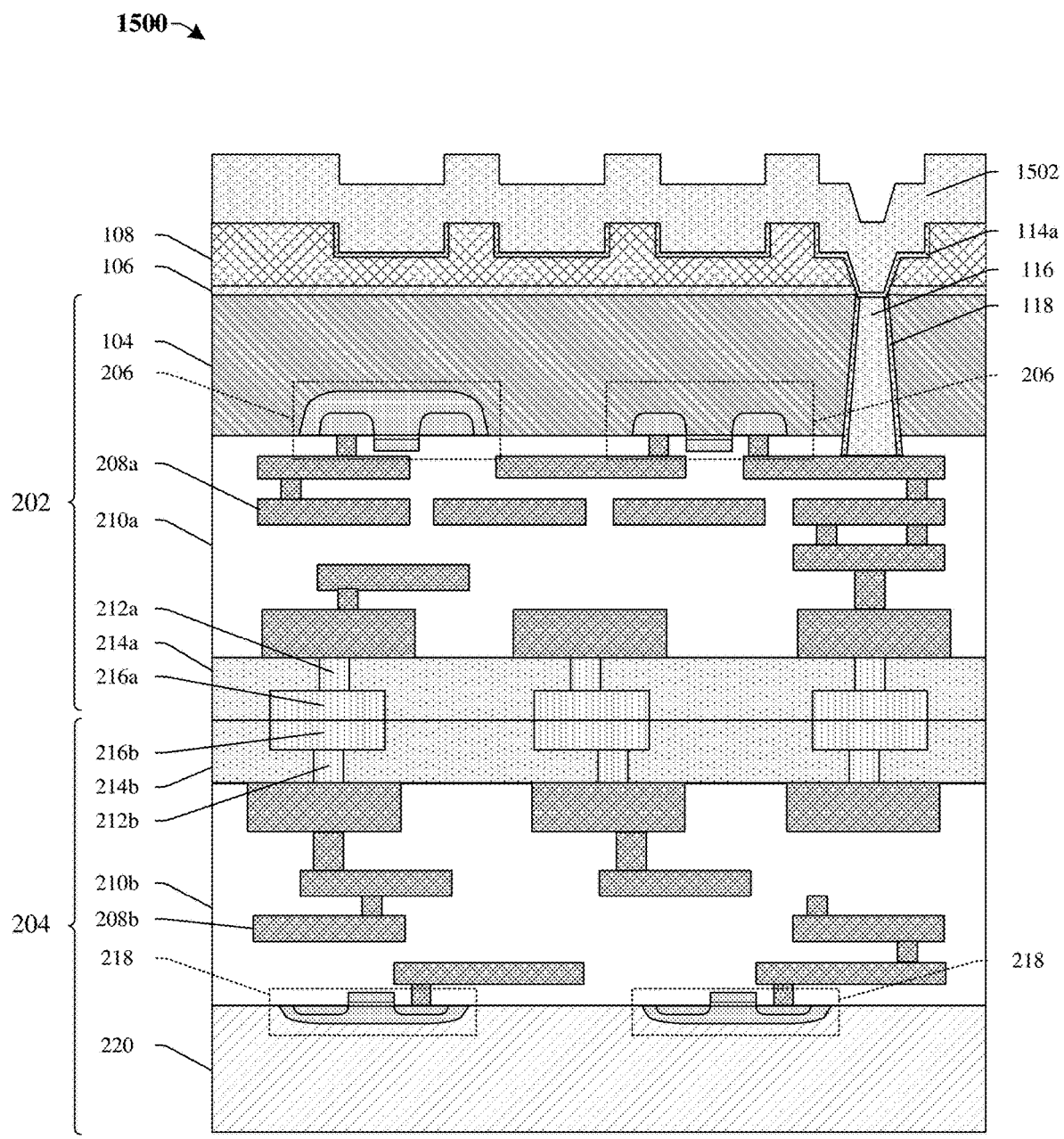

As shown in the cross-sectional view 1500 of FIG. 15, a first conformal conductive layer 1502 is formed over the first barrier layer 114a and the first dielectric layer 108. In some embodiments, the first conformal conductive layer 1502 comprises a same material as the TSV 116. In some embodiments, the first conformal conductive layer 1502 is formed using a deposition process (e.g., and atomic layer deposition (ALD) process). Other suitable processes are within the contemplated scope of the disclosure.

Figure 16:
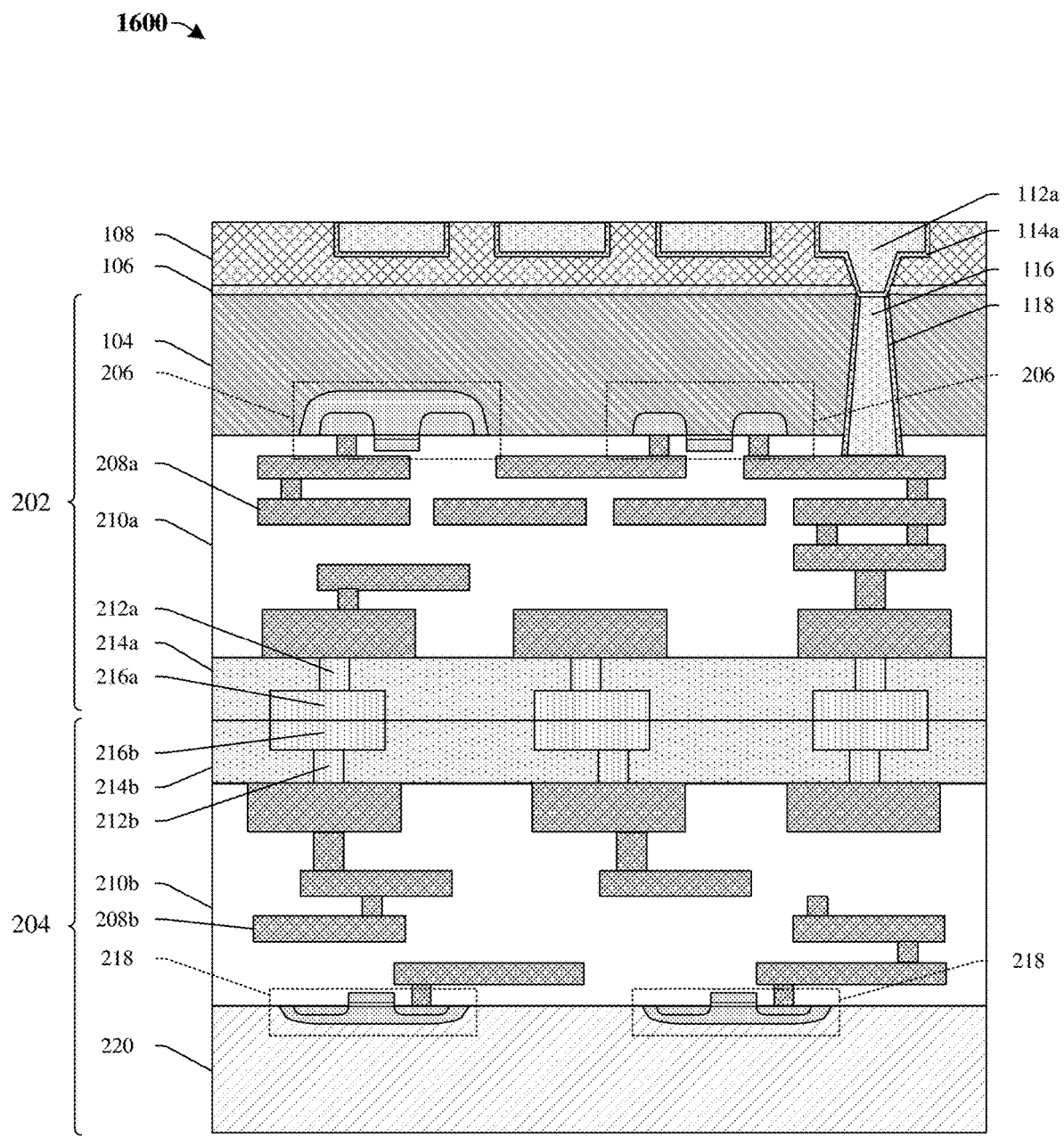

As shown in the cross-sectional view 1600 of FIG. 16, portions of the first conformal conductive layer 1502 above the first dielectric layer 108 are removed, leaving the first conductive wire 112a within the first spiral trench 1202 and the first via hole 1204. In some embodiments, the portions of the first conformal conductive layer 1502 are removed using a chemical mechanical polishing or chemical mechanical planarization (CMP) process. Other suitable processes are within the contemplated scope of the disclosure.

Figure 17:
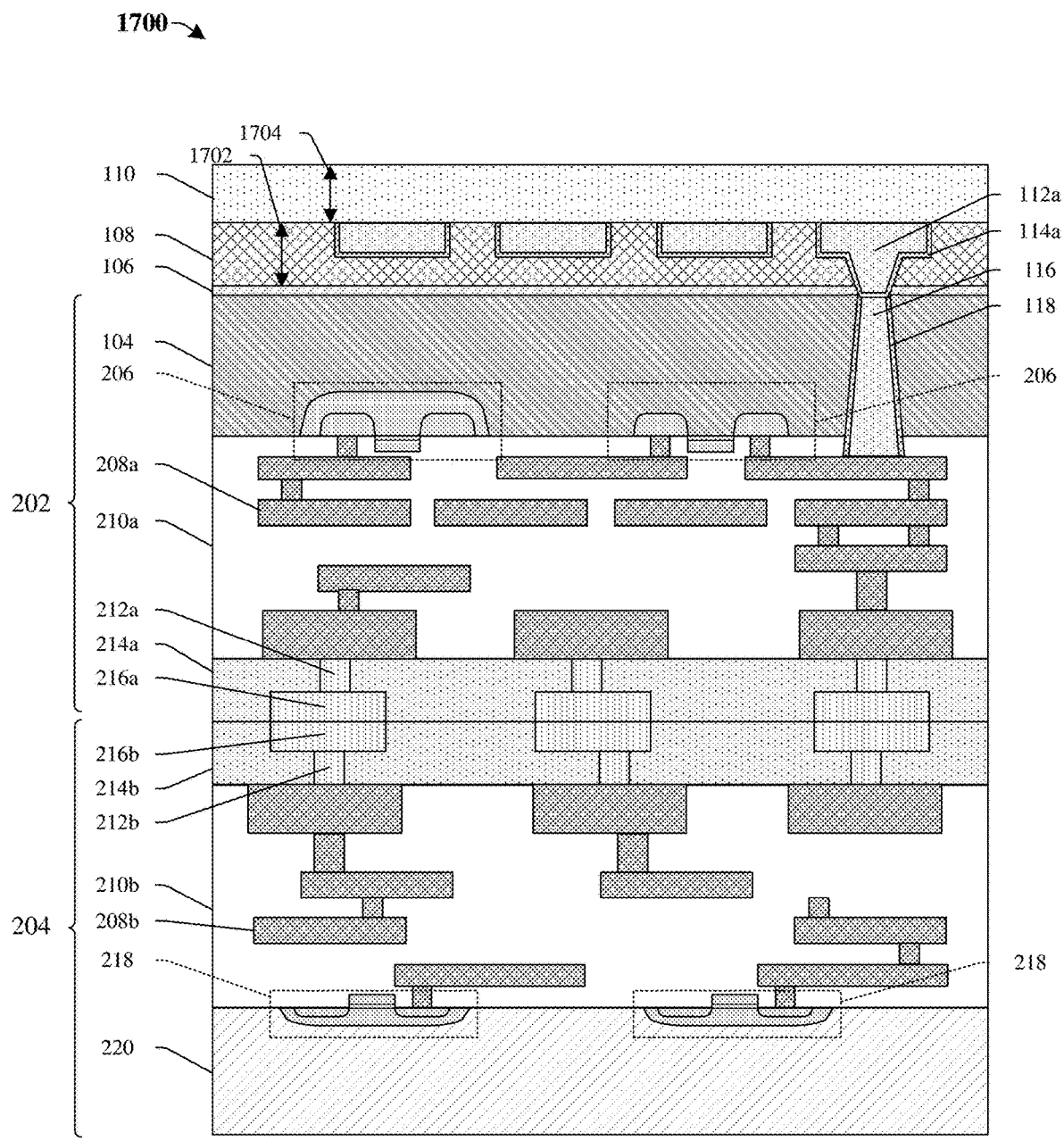

As shown in the cross-sectional view 1700 of FIG. 17, the second dielectric layer 110 is formed over the first conductive wire 112a and the first dielectric layer 108. In some embodiments, the second dielectric layer 110 comprises a same material as the first dielectric layer 108. In some embodiments, the first dielectric layer has a first thickness 1702 and the second dielectric layer 110 has a second thickness 1704 lower than the first thickness 1702 and a lower thermal conductivity than the first dielectric layer 108. In some embodiments, the first conductive wire 112a directly contacts the second dielectric layer 110. In other embodiments, an additional segment of the first barrier layer 114a is formed over the first conductive wire 112a, separating the first conductive wire 112a from the second dielectric layer 110. In some embodiments, the second dielectric layer 110 is formed using a deposition process (e.g., and physical vapor deposition (PVD) process). Other suitable processes are within the contemplated scope of the disclosure.

Figure 18:
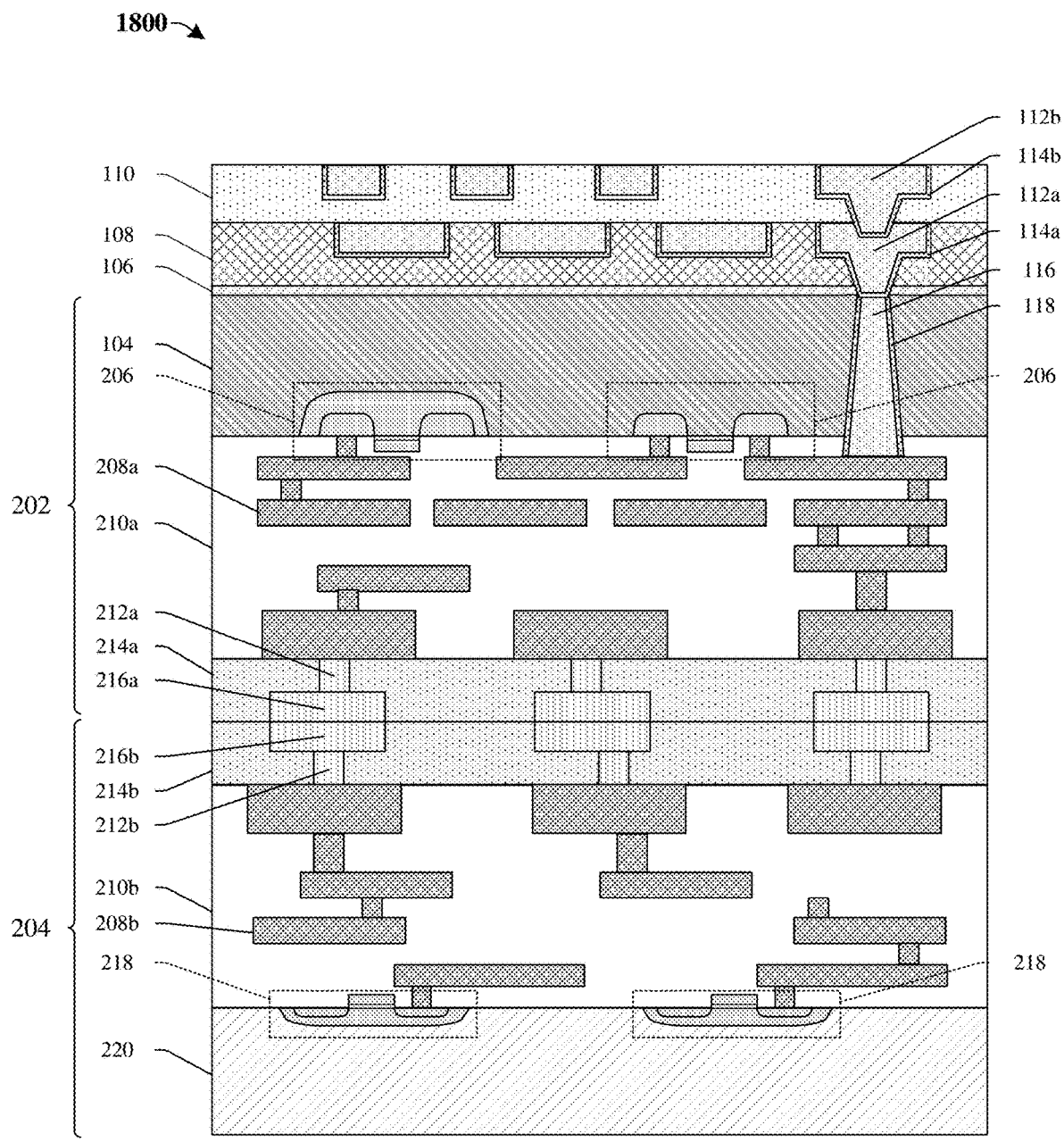

As shown in the cross-sectional view 1800 of FIG. 18, the second barrier layer 114b and the second conductive wire 112b are formed within a second spiral trench (not shown) the second dielectric layer 110. It will be appreciated that the second barrier layer 114b is formed in a similar manner to the first barrier layer 114a and the second conductive wire 112b is formed in a similar manner to the first conductive wire 112a. In some embodiments, the second spiral trench follows the same spiral pattern as the first spiral trench 1202. In other embodiments, the second spiral trench follows a different spiral pattern than the first spiral trench 1202.

Once the second barrier layer 114b and the second conductive wire 112b are formed in the second dielectric layer 110, the process is completed by forming the etch stop layer 226, third dielectric layer 224, and bonding pads 222 coupled to the first and second conductive wires 112a, 112b. After processing is completed, for example after the RDL stack 102 is formed, the RDL stack 102, first die 202, and second die 204 are then singulated into individual dies which can correspond to individual ICs.

FIG. 19 illustrates a methodology 1900 of forming an RDL stack in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

In act 1902, a substrate is removed from the first side of a first die to expose a first dielectric layer. FIGS. 10-11 illustrate a series of cross-sectional views 1000-1100 of some embodiments corresponding to act 1902.

In act 1904, a spiral trench is formed in the first dielectric layer with one end of the spiral trench directly over a through silicon via (TSV) beneath the first dielectric layer. FIG. 12 illustrates a cross-sectional view 1200 of an embodiment corresponding to act 1904.

In act 1906, a first barrier layer is formed along sidewalls of the spiral trench, the first barrier layer being thermally coupled to the TSV. FIGS. 13-14 illustrate a series of cross-sectional views 1300-1400 of some embodiments corresponding to act 1906.

In act 1908, a first conductive wire is formed within the spiral trench that is separated from the first dielectric layer by the first barrier layer and has a first phonon density of state (DOS) profile, wherein the first dielectric layer has a second phonon DOS profile, and wherein the first phonon DOS profile has a peak outside the frequency range of the second phonon DOS profile, and wherein the first barrier layer has a third phonon DOS profile overlapping a peak of the first phonon DOS profile and overlapping a portion the second phonon DOS profile. FIGS. 15-16 illustrate a series of cross-sectional views 1500-1600 of some embodiments corresponding to act 1908.

Some embodiments relate to a 3D integrated circuit stack including a first die and a second die. The first die includes a first substrate and a first interconnect structure. The second die is bonded to the first die, and includes a second substrate and a second interconnect structure. The first and second interconnect structures are arranged between the first and second substrates. A redistribution layer (RDL) stack is arranged on an outer side of the first die opposite the first interconnect structure. A heat path includes a through substrate via (TSV) extending from a conductive layer in the first interconnect structure, through the first substrate, and into the RDL stack. An RDL dielectric material is included in the RDL stack and separates the heat path from an ambient environment surrounding the 3D integrated circuit stack. The RDL dielectric material has an RDL thermal conductivity that is over twenty times an interconnect thermal conductivity of an interconnect dielectric material of the first interconnect structure or of the second interconnect structure.

Some embodiments relate to a 3D integrated circuit stack comprising a first die bonded to a second die. The first die has first semiconductor devices with a higher thermal output during operation than second semiconductor devices in the second die. A first conductive wire is thermally coupled to the first die and has a first phonon density of state (DOS) profile. A first dielectric layer surrounds the first conductive wire and has a second phonon DOS profile that is zero at a frequency of a peak of the first phonon DOS profile. A first barrier layer between the first dielectric layer and the first conductive wire and has a third phonon DOS profile that overlaps the peak of the first phonon DOS profile and a peak of the second phonon DOS profile.

Some embodiments relate to a method of forming a redistribution layer (RDL) stack of a 3D integrated circuit stack. The method comprises removing a substrate form the first side of a first die to expose a first dielectric layer. A spiral trench is formed in the first dielectric layer with one end of the spiral trench directly over a through silicon via (TSV) beneath the first dielectric layer. A first barrier layer is formed along sidewalls of the spiral trench, the first barrier layer being thermally coupled to the TSV. A first conductive wire is formed within the spiral trench, separated from the first dielectric layer by the barrier layer and having a first phonon DOS profile. The first dielectric layer has a second phonon DOS profile. The first phonon DOS profile has a peak outside the frequency range of the second phonon DOS profile. The first barrier layer has a third phonon DOS profile that overlaps a peak of the first phonon DOS profile and overlaps a portion of the second phonon DOS profile.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a redistribution layer (RDL) stack of a 3D integrated circuit stack, comprising:
   removing a substrate from a first side of a first die to expose a first dielectric layer;
   forming a spiral trench in the first dielectric layer with one end of the spiral trench directly over a through silicon via (TSV) beneath the first dielectric layer;
   forming a first barrier layer along sidewalls of the spiral trench, the first barrier layer being thermally coupled to the TSV; and
   forming a first conductive wire within the spiral trench that is separated from the first dielectric layer by the first barrier layer, wherein the RDL stack is thermally coupled to the first die both through the TSV and through a composite dielectric between a semiconductor substrate of the first die and the first dielectric layer, while the semiconductor substrate and the first dielectric layer are electrically isolated from one another by the composite dielectric.

2. The method of claim 1, further comprising:
   forming the first die before removing the substrate, further comprising:
   forming a plurality of semiconductor devices on and/or in the semiconductor substrate;
   forming the TSV extending through the semiconductor substrate; and
   forming a first interconnect structure over the plurality of semiconductor devices, wherein
   the first interconnect structure electrically couples a semiconductor device of the plurality of semiconductor devices to the TSV, and wherein
   after forming the first conductive wire, the first interconnect structure, the TSV, and the first conductive wire form a thermally conductive heat path between the semiconductor devices and the first dielectric layer.

3. The method of claim 1, further comprising:
   forming a second dielectric layer over the first dielectric layer and the first conductive wire;
   forming a second spiral trench in the second dielectric layer with one end of the second spiral trench directly over the TSV beneath the first dielectric layer; and
   forming a second conductive wire within the second spiral trench, wherein the first conductive wire extends across the first dielectric layer in a first spiral pattern corresponding to the spiral trench, and the second conductive wire extends across the second dielectric layer in a second spiral pattern corresponding to the second spiral trench, and wherein the second spiral pattern is different from the first spiral pattern.

4. The method of claim 1, wherein the composite dielectric has a first thickness, and the first dielectric layer has a second thickness, and wherein the second thickness is over double the first thickness.

5. The method of claim 1, wherein forming the spiral trench further comprises forming a first via hole, and wherein the first via hole and the TSV extend into the composite dielectric.

6. A method of forming an integrated device, comprising:
   forming a through substrate via (TSV) extending through a first substrate towards a first dielectric layer, the first dielectric layer extending between the first substrate and a carrier substrate;
   forming a first interconnect structure on the first substrate coupled to the TSV;
   removing the carrier substrate from the first dielectric layer;
   etching a first spiral trench into the first dielectric layer, the first spiral trench exposing the TSV;
   forming a first barrier layer extending along inner sidewalls of the first spiral trench; and
   filling the first spiral trench with a first conductive wire; and
   forming a second dielectric layer over the first dielectric layer, the second dielectric layer having a lower thickness and a lower thermal conductivity than the first dielectric layer.

7. The method of claim 6, wherein the first conductive wire directly contacts the second dielectric layer.

8. The method of claim 6, wherein the second dielectric layer covers a top surface of the first dielectric layer and the first conductive wire.

9. The method of claim 6, further comprising:
   forming a plurality of semiconductor devices at a surface of the first substrate before forming the first interconnect structure, wherein the forming of the first interconnect structure comprises electrically coupling a semiconductor device of the plurality of semiconductor devices to the first interconnect structure, and wherein the first interconnect structure, the TSV, and the first conductive wire form a thermally conductive heat path between the semiconductor devices and the first dielectric layer.

10. The method of claim 9, wherein forming the first interconnect structure comprises forming an interconnect dielectric surrounding wires of the first interconnect structure, and wherein a material of the first dielectric layer has a thermal conductivity over twenty times a thermal conductivity of a material of the interconnect dielectric.

11. The method of claim 6, further comprising forming a second barrier layer extending along inner sidewalls of the first barrier layer before forming the first conductive wire.

12. The method of claim 6, further comprising:
etching a second spiral trench into the second dielectric layer, the second spiral trench having a different spiral pattern from the first spiral trench; and
forming a second conductive wire in the second spiral trench.

13. The method of claim 6, wherein forming the TSV further comprises etching a via hole through the first substrate, forming a via barrier layer within the via hole, and forming a conductive fill in the via hole; and
wherein etching a first spiral trench removes a portion of the via barrier layer.

14. The method of claim 6, wherein the TSV extends into a composite dielectric separating the first substrate from the first dielectric layer, and wherein the first barrier layer extends through the composite dielectric and into the first substrate.

15. The method of claim 6, wherein the TSV extends into a composite dielectric separating the first substrate from the first dielectric layer, and wherein after the TSV is formed, the TSV is separated from the first dielectric layer by the composite dielectric.

16. A method of forming an integrated device, comprising:
forming through substrate via (TSV) extending through a first substrate to a first dielectric layer extending between the first substrate and a carrier substrate;
removing the carrier substrate;
etching a first via hole over the TSV;
etching a first trench into the first dielectric layer, the first trench extending in a first spiral pattern across an exposed surface of the first dielectric layer, wherein a combination of the first via hole and the first trench expose the TSV;
forming a first conductive wire within the first trench;
forming a second dielectric layer over the first dielectric layer and the first conductive wire;
etching a second via hole over the first via hole;
etching a second trench into the second dielectric layer, the second trench extending across an exposed surface of the second dielectric layer, wherein a combination of the second via hole and the second trench expose the first conductive wire; and
forming a second conductive wire within the second trench, wherein the first conductive wire extends across the first dielectric layer in a first pattern, and the second conductive wire extends across the second dielectric layer in a second pattern, such that portions of the first conductive wire extend past outer sidewalls of the second conductive wire, and wherein the second pattern of the second conductive wire is a second spiral pattern different from the first spiral pattern.

17. The method of claim 16, further comprising:
forming a third dielectric layer over the second dielectric layer and the second conductive wire; and
forming bonding pads within the third dielectric layer, the bonding pads coupling to one of the first conductive wire or the second conductive wire.

18. The method of claim 16, wherein the second spiral pattern is displaced from the first spiral pattern such that multiple segments of the second conductive wire are laterally displaced from the first conductive wire in a first direction.

19. The method of claim 16, wherein the second spiral pattern directly overlies the first spiral pattern, such that a segment of the second spiral pattern is laterally displaced from segments of the first conductive wire in a first direction, a second direction opposite the first direction, a third direction perpendicular to the first direction and the second direction, and a fourth direction opposite the third direction.

20. The method of claim 16, further comprising:
forming a plurality of semiconductor devices on and/or in the first substrate before removing the carrier substrate; and
forming a first interconnect structure over the plurality of semiconductor devices, wherein
the first interconnect structure electrically couples a semiconductor device of the plurality of semiconductor devices to the TSV, and wherein
the first interconnect structure, the TSV, and the first conductive wire form a thermally conductive heat path between the semiconductor device and the first dielectric layer.

* * * * *